(12) United States Patent
Iwai et al.

(10) Patent No.: US 11,057,996 B2
(45) Date of Patent: Jul. 6, 2021

(54) CIRCUIT BOARD, METHOD OF MANUFACTURING CIRCUIT BOARD, AND ELECTRONIC DEVICE

(71) Applicant: FUJITSU LIMITED, Kawasaki (JP)

(72) Inventors: Toshiki Iwai, Atsugi (JP); Daisuke Mizutani, Sagamihara (JP); Seiki Sakuyama, Yamato (JP); Taiji Sakai, Yokohama (JP)

(73) Assignee: FUJITSU INTERCONNECT TECHNOLOGIES LIMITED, Nagano (JP)

( * ) Notice: Subject to any disclaimer, the term of this patent is extended or adjusted under 35 U.S.C. 154(b) by 0 days.

(21) Appl. No.: 16/430,735

(22) Filed: Jun. 4, 2019

(65) Prior Publication Data
US 2019/0289715 A1    Sep. 19, 2019

Related U.S. Application Data

(63) Continuation of application No. PCT/JP2017/046639, filed on Dec. 26, 2017.

(30) Foreign Application Priority Data

Jan. 16, 2017 (JP) .............................. JP2017-004844

(51) Int. Cl.
*H05K 1/02* (2006.01)
*H05K 1/03* (2006.01)
(Continued)

(52) U.S. Cl.
CPC ............ *H05K 1/116* (2013.01); *H01L 21/481* (2013.01); *H01L 21/486* (2013.01);
(Continued)

(58) Field of Classification Search
CPC ... H05K 1/02; H05K 1/03; H05K 1/11; H05K 3/00; H05K 3/10; H05K 3/16; H05K 3/36;
(Continued)

(56) References Cited

U.S. PATENT DOCUMENTS 5,346,750 A * 9/1994 Hatakeyama .......... H05K 3/462
428/209
5,484,647 A * 1/1996 Nakatani .............. H05K 3/4069
361/748
(Continued)

FOREIGN PATENT DOCUMENTS

JP    57-134987 A    8/1982
JP    10-270851 A    10/1998
(Continued)

OTHER PUBLICATIONS

International Search Report dated Feb. 27, 2018, issued in counterpart application No. PCT/JP2017/046639, w/English translation (6 pages).
(Continued)

*Primary Examiner* — Xiaoliang Chen
(74) *Attorney, Agent, or Firm* — Westerman, Hattori, Daniels & Adrian, LLP

(57) ABSTRACT

A circuit board includes: a first substrate including a first through hole, a first metal layer formed over an inner wall of the first through hole, and a first conductive composite resin provided on an inner side of the first metal layer of the first through hole; and a second substrate stacked together with the first substrate and including a second through hole that faces the first through hole and has a first open end which is provided on a side of the first through hole and is located on the inner side of the first metal layer, and a second conductive composite resin that is provided in the second
(Continued)

through hole and is coupled to the first conductive composite resin.

11 Claims, 21 Drawing Sheets

(51) Int. Cl.
| | |
|---|---|
| *H05K 1/11* | (2006.01) |
| *H05K 3/00* | (2006.01) |
| *H05K 3/10* | (2006.01) |
| *H05K 3/16* | (2006.01) |
| *H05K 3/36* | (2006.01) |
| *H05K 3/40* | (2006.01) |
| *H05K 3/46* | (2006.01) |
| *H01L 21/48* | (2006.01) |
| *H01L 21/56* | (2006.01) |
| *H01L 23/34* | (2006.01) |
| *H01L 23/48* | (2006.01) |
| *H01L 23/52* | (2006.01) |
| *H01L 23/498* | (2006.01) |
| *H05K 3/42* | (2006.01) |
| *H05K 1/18* | (2006.01) |

(52) U.S. Cl.
CPC .... *H01L 21/4857* (2013.01); *H01L 23/49822* (2013.01); *H01L 23/49838* (2013.01); *H05K 3/0032* (2013.01); *H05K 3/40* (2013.01); *H05K 3/423* (2013.01); *H05K 3/426* (2013.01); *H05K 3/429* (2013.01); *H05K 3/46* (2013.01); *H05K 3/4644* (2013.01); *H05K 3/4688* (2013.01); *H05K 1/181* (2013.01); *H05K 2201/096* (2013.01); *H05K 2201/097* (2013.01); *H05K 2203/0723* (2013.01)

(58) Field of Classification Search
CPC . H05K 3/40; H05K 3/46; H01L 21/48; H01L 21/56; H01L 23/34; H01L 23/48; H01L 23/52; H01L 23/489
USPC ....... 174/260, 250, 251, 255, 257, 261–264; 257/758; 428/209; 252/514
See application file for complete search history.

(56) References Cited

U.S. PATENT DOCUMENTS

| | | | | |
|---|---|---|---|---|
| 6,190,834 | B1* | 2/2001 | Narahara | C08F 290/14 430/284.1 |
| 6,237,218 | B1* | 5/2001 | Ogawa | H05K 3/4638 174/254 |
| 6,262,579 | B1* | 7/2001 | Chazan | H01L 21/4857 324/537 |
| 6,320,140 | B1* | 11/2001 | Enomoto | H05K 3/4617 174/255 |
| 6,630,630 | B1* | 10/2003 | Maezawa | H05K 3/4069 174/255 |
| 9,669,772 | B2* | 6/2017 | Kono | H04N 5/2257 |
| 9,893,016 | B2* | 2/2018 | Sakamoto | H05K 3/4658 |
| 10,674,604 | B2* | 6/2020 | Ishihara | H05K 1/181 |
| 2001/0009273 | A1* | 7/2001 | John | H01B 1/22 252/514 |
| 2002/0150741 | A1* | 10/2002 | Curcio | H05K 3/462 428/209 |
| 2002/0158307 | A1* | 10/2002 | Honda | H01G 4/232 257/532 |
| 2003/0011070 | A1* | 1/2003 | Iijima | H01L 21/4857 257/734 |
| 2003/0085058 | A1* | 5/2003 | Komatsu | H05K 3/4069 174/264 |
| 2004/0231151 | A1* | 11/2004 | Nakatani | H05K 3/4614 29/830 |
| 2005/0011677 | A1* | 1/2005 | Yoshino | H05K 3/4038 174/263 |
| 2005/0012217 | A1* | 1/2005 | Mori | H01L 23/49822 257/758 |
| 2005/0126818 | A1* | 6/2005 | Kojima | H05K 3/4602 174/255 |
| 2005/0155792 | A1* | 7/2005 | Ito | H05K 3/4069 174/264 |
| 2006/0057341 | A1* | 3/2006 | Kawabata | C25D 5/022 428/209 |
| 2009/0296349 | A1* | 12/2009 | Suzuki | H05K 1/141 361/705 |
| 2010/0218986 | A1* | 9/2010 | Furuta | H01L 21/4846 174/263 |
| 2011/0147055 | A1* | 6/2011 | Ma | H01L 21/4803 174/255 |
| 2011/0209905 | A1* | 9/2011 | Morita | H05K 3/4602 174/257 |
| 2011/0244636 | A1* | 10/2011 | Kondo | H01L 23/49822 438/127 |
| 2011/0266666 | A1* | 11/2011 | Maeda | H01L 23/3128 257/698 |
| 2013/0081861 | A1* | 4/2013 | Harazono | H05K 1/0366 174/255 |
| 2013/0153269 | A1* | 6/2013 | Takahashi | H05K 1/115 174/254 |
| 2013/0153279 | A1* | 6/2013 | Hayashi | H05K 3/4673 174/260 |
| 2013/0180765 | A1* | 7/2013 | Aoshima | B32B 17/10036 174/255 |
| 2014/0225701 | A1* | 8/2014 | Morita | H01F 17/0013 336/200 |
| 2014/0231126 | A1* | 8/2014 | Hunrath | H05K 3/4614 174/264 |
| 2014/0311772 | A1* | 10/2014 | Mizutani | H05K 3/429 174/251 |
| 2015/0313018 | A1* | 10/2015 | Maeda | H05K 1/0366 174/255 |
| 2016/0128201 | A1* | 5/2016 | Ciufo | H05K 3/4069 29/852 |
| 2016/0205780 | A1* | 7/2016 | Lee | H05K 3/4038 361/783 |
| 2017/0018492 | A1* | 1/2017 | Imayoshi | H01L 21/486 |
| 2017/0372952 | A1* | 12/2017 | Birner | H01L 21/76879 |
| 2018/0153044 | A1* | 5/2018 | Habu | H05K 1/11 |

FOREIGN PATENT DOCUMENTS

| | | |
|---|---|---|
| JP | 2004-288989 A | 10/2004 |
| JP | 2007-335584 A | 12/2007 |
| JP | 2016-46267 A | 4/2016 |
| WO | 97/48260 A1 | 12/1997 |

OTHER PUBLICATIONS

Written Opinion dated Feb. 27, 2018, issued in counterpart application No. PCT/JP2017/046639, w/English translation (9 pages).

* cited by examiner

CIRCUIT BOARD, METHOD OF MANUFACTURING CIRCUIT BOARD, AND ELECTRONIC DEVICE

CROSS-REFERENCE TO RELATED APPLICATION

This application is a continuation application of International Application PCT/JP2017/046639 filed on Dec. 26, 2017 and designated the U.S., the entire contents of which are incorporated herein by reference. The International Application PCT/JP2017/046639 is based upon and claims the benefit of priority of the prior Japanese Patent Application No. 2017-004844, filed on Jan. 16, 2017, the entire contents of which are incorporated herein by reference.

FIELD

The embodiments discussed herein are related to circuit boards, methods of manufacturing a circuit board, and electronic devices.

BACKGROUND

A multi-layer printed circuit board is a type of a circuit board.

Japanese Laid-open Patent Publication No. 10-270851 and Japanese Laid-open Patent Publication No. 2004-288989 are disclosed as related art.

SUMMARY

According to an aspect of the embodiments, a circuit board includes: a first substrate including a first through hole, a first metal layer formed over an inner wall of the first through hole, and a first conductive composite resin provided on an inner side of the first metal layer of the first through hole; and a second substrate stacked together with the first substrate and including a second through hole that faces the first through hole and has a first open end which is provided on a side of the first through hole and is located on the inner side of the first metal layer, and a second conductive composite resin that is provided in the second through hole and is coupled to the first conductive composite resin.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In regard to multi-layer printed circuit boards, vias or through holes using a metal and a conductive paste are used for coupling layers. For example, a metal film is formed on the inner surface of a hole penetrating an insulating hard substrate and an adhesive layer on the insulating hard substrate, the remaining portion of the hole is filled with a conductive paste to form a circuit board, the circuit board is stacked via adhesive layers, and the metal film and the metal on the substrate surface are coupled or the respective metal films are coupled to each other. For example, printed circuit boards that have copper lands and through holes (plated through holes) connected to the copper lands are stacked via prepreg members that have a greater diameter than the through holes and are provided with a penetrating conductive paste, and upper and lower lands are coupled by the conductive paste.

In a circuit board, due to heat or an external force, stress might be generated at the via connecting portions between stacked substrates, such as the connecting portions between the above described metal film and the metal on a substrate surface or between the metal films, or the connecting portions between upper and lower lands having a conductive paste in between. If excessive stress is generated at the via connecting portions in a circuit board, damage such as cracks might be caused at the via connecting portions and the vicinities thereof, and such damage might degrade the performance and the reliability of the circuit board.

First, an example of a circuit board is described.

Figure 1A:
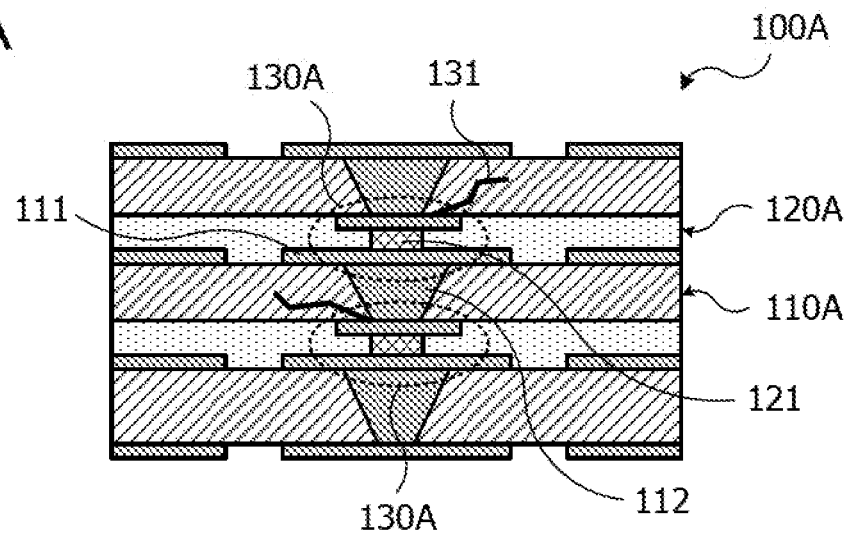
FIGS. 1A to 1C are explanatory views of examples of circuit boards.
Figure 1B:
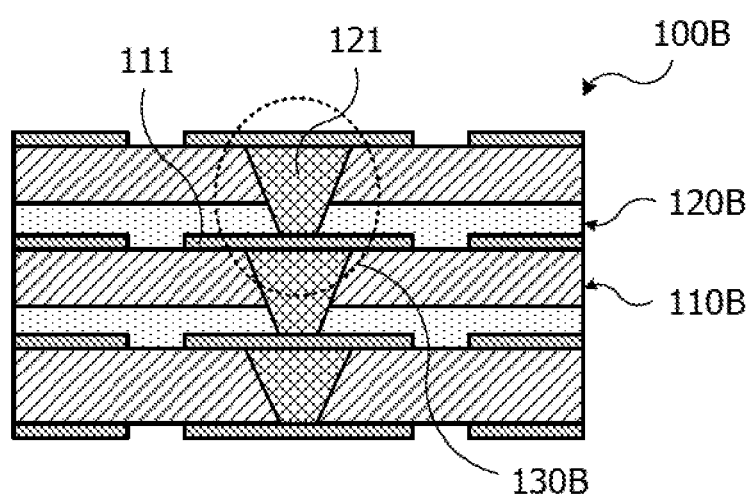
Figure 1C:
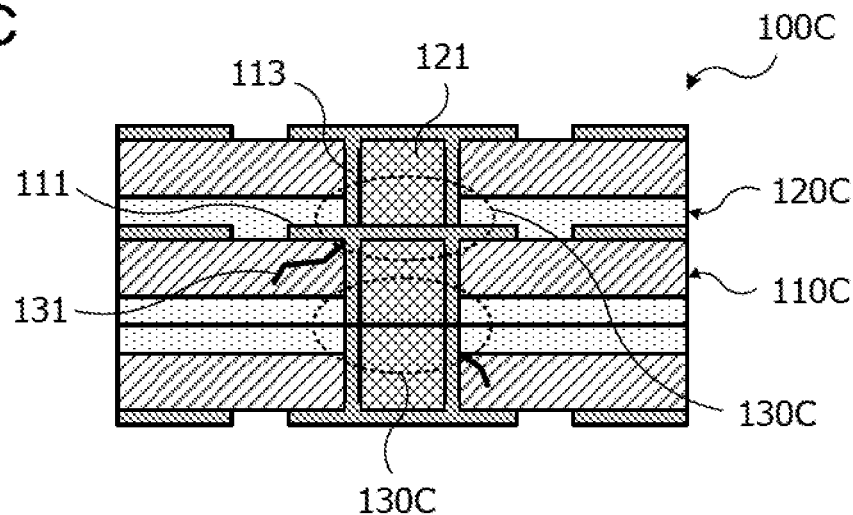

FIGS. 1A to 1C are explanatory views of examples of circuit boards. FIG. 1A schematically illustrates a cross section of the relevant part of a first example of a circuit board. FIG. 1B schematically illustrates a cross section of the relevant part of a second example of a circuit board. FIG. 1C schematically illustrates a cross section of the relevant part of a third example of a circuit board.

A circuit board 100A illustrated in FIG. 1A has a structure in which substrates 110A having metal layers 111 serving as lands and wiring lines formed with copper (Cu) or the like on the front and back surfaces thereof, and substrates (resin substrates) 120A formed with resin are alternately stacked. Each substrate 110A has vias (filled vias) 112 that are formed by filling through holes penetrating therethrough with Cu or the like and electrically connect the metal layers 111 on the front and back surfaces. The electrical connection between the substrates 110A (between the respective metal layers 111) stacked via the resin substrates 120A is established by vias of conductive composite resins 121 that are formed by filling through holes penetrating the resin substrates 120A with a conductive paste (a resin containing a conductive filler). Such a circuit board 100A is formed by a method of alternately stacking the substrates 110A and the resin substrates 120A that are prepared in advance, and heating and pressing (thermally pressing) the stacked substrates 110A and resin substrates 120A by vacuum heat pressing or the like, for example. This method is a so-called collective lamination technique.

A circuit board 100B illustrated in FIG. 1B has a structure in which substrates 110B having metal layers 111 serving as lands and wiring lines formed on the front and back surfaces thereof with Cu or the like, and resin substrates 120B are alternately stacked. In the circuit board 100B, the electrical connection between the substrates 110B (between the respective metal layers 111) stacked via the resin substrates 120B is established by vias of conductive composite resins 121 that are formed by filling through holes penetrating each set of a substrate 110B and a resin substrate 120B with a conductive paste. Such a circuit board 100B is formed by a collective lamination technique by which sets of a substrate 110B and a resin substrate 120B having a conductive composite resin 121 as a via in between are prepared beforehand, and are joined and thermally pressed together, for example.

A circuit board 100C illustrated in FIG. 1C has a structure in which substrates 110C having metal layers 111 serving as lands and wiring lines formed on the front and back surfaces thereof with Cu or the like, and resin substrates 120C are alternately stacked. In the circuit board 100C, metal layers 113 of Cu or the like are formed on the inner walls of through holes penetrating sets of a substrate 110C and a resin substrate 120C, and conductive composite resins 121 ire formed by filling the inner side of the metal layers 113 with a conductive paste. The metal layers 113 and the conductive composite resins 121 are used as vias. In the circuit board 100C, the vias on the upper side (the metal layers 113 and the conductive composite resins 121) are connected to the metal layers 111 on the upper side, or the vias in upper and lower layers are connected (the metal layers 113 are connected to one another, and the conductive composite resins 121 are connected to one another). Further, the substrates 110C stacked via the resin substrates 120C are electrically connected to one another. Such a circuit board 100C is formed by a collective lamination technique by which sets of a substrate 110C and a resin substrate 120C having metal layers 113 a conductive composite resin 121 as a via in between are prepared beforehand, and are joined and thermally pressed together, for example.

In each of the circuit board 100A, the circuit board 100B, and the circuit board 100C described above, the problems mentioned below might occur.

For example, in the circuit board 100A, the filled vias 112 are formed with a material having a relatively high thermal expansion coefficient and a relatively high elastic modulus, such as Cu. In this case, when thermal expansion and thermal contraction occur in the filled vias 112 due to heat applied at the time of collective lamination by thermal pressing or after the formation of the circuit board 100A, the substrates 110A surrounding the filled vias 112 might have damage such as cracks 131, as illustrated in FIG. 1A.

Further, in the circuit board 100A, stress might be generated in the metal layers 111 in the upper and lower layers and via connecting portions 130A of the conductive composite resins 121 connecting the metal layers 111, due to pressure applied at the time of collective lamination by thermal pressing, and an external force applied in the stacking direction after the formation of the circuit board 100A. For example, in the circuit board 100A, a force against the pressing or a force generated by thermal expansion or the like is applied to the conductive composite resins 121 interposed between the metal layers 111 in the upper and lower layers, and such a force is also applied to the metal layers 111 having a relatively high elastic modulus and the filled vias 112 connected to the metal layers 111. The force generated by thermal expansion or the like as described above can also act on the filled vias 112. As such various forces are applied, stress is generated in the via connecting portions 130A. If the stress in the via connecting portions 130A becomes too high, damage such as the cracks 131 might occur in the substrates 110A, as illustrated in FIG. 1A.

Such damage to the substrates 110A might degrade the performance and the reliability of the circuit board 100A.

In the circuit board 100B, the resistance value of the conductive composite resins 121 containing a conductive filler in the resin is much higher than that of the Cu or the like used as the metal layers 111 (for example, at least several hundred times higher than the resistance value of Cu). In a via connecting portion 130B in which the upper and lower metal layers 111 are connected only by a conductive composite resin 121 as illustrated in FIG. 1B, its resistance value is high, and therefore, preferable performance might be difficult to achieve depending on the purpose of use. For example, in a case where the circuit board 100B is used at high frequency, preferable transmission characteristics of high-frequency signals are hardly achieved, and it is difficult to obtain a high-performance electronic device or electronic apparatus using the circuit board 100B.

In the circuit board 100C, unlike the filled vias 112 of the above described circuit board 100A, vias are formed with the metal layers 113 formed on the inner walls of the through holes, and the conductive composite resins 121 filling the inner side of the metal layers 113. Accordingly, even if the metal layers 113 are formed with a material having a relatively high thermal expansion coefficient and a relatively high elastic modulus, the forces generated by the thermal expansion and the like are reduced. Further, as the elastic modulus of the conductive composite resins 121 filling the inside is relatively low, the forces that are applied in the vicinity are also expected to be reduced.

In the circuit board 100C, however, due to the pressure at the time of collective lamination and the external force applied thereafter, stress might be generated in via connecting portions 130C by which the metal layers 113 on the via inner walls on the upper side are connected to the metal layers 111 on the lower side, or the metal layers 113 on the via inner walls on the upper and lower sides are connected to each other. For example, the force generated when portions formed with a material having a relatively high elastic modulus are brought into contact with each other and are pressed against each other concentrates on the portions, and stress is generated in the vicinities and the via connecting portions 130C. If the stress in the via connecting portions 130C becomes too high, damage such as cracks 131 might occur in the substrates 110C as illustrated in FIG. 1C, and such damage might degrade the performance and the reliability of the circuit board 100C.

As described above, in the circuit board 100A, there are cases where stress is generated in the vicinities of the metal layers 111 sandwiching the conductive composite resins 121, and the substrates 110A are damaged. In the circuit board 100C, there are cases where stress is generated in the vicinities of the metal layers 113 and the metal layers 111 in contact with each other or in the vicinities of the metal layers 113 in contact with one another, and the substrates 110C are damaged. In the circuit board 100B, it might be difficult to achieve preferable performance, because of the structure of the via connecting portions 130B with which the conductive composite resins 121 serve as the vias.

Meanwhile, the substrates 110A, the substrates 110B, and the substrates 110C formed with various insulating materials may be used in the circuit board 100A, the circuit board 100B, and the circuit board 100C, respectively. In the circuit board 100A, the circuit board 100B, and the circuit board 100C, substrates (glass substrates) formed with glass among the various insulating materials are adopted as the substrates 110A, the substrates 110B, and the substrates 110C in some cases, from the viewpoint of high-density packaging of electronic components, for example.

A glass substrate has a thermal expansion coefficient similar to that of silicon (Si) used for electronic components such as a semiconductor chip to be mounted, or may have a similar thermal expansion coefficient through adjustment of the composition. Accordingly, a glass substrate can reduce the thermal expansion coefficient mismatch with respect to electronic components, as compared with a substrate formed with an organic material. Where glass substrates are used, damage to the portions connecting to electronic components due to thermal expansion and thermal contraction can be reduced. Further, the portions connecting to electronic components can be made smaller in size, and the pitch can be narrowed. This enables high-density packaging of electronic components.

However, Cu, for example, has a higher thermal expansion coefficient than that of glass. Therefore, if glass substrates are used as the substrates 110A, and the filled vias 112 are formed with Cu in the circuit board 100A, there is a possibility that damage such as the cracks 131 will be caused in the glass substrates due to thermal expansion and thermal contraction of the filled vias 112. Further, in the circuit board 100A, if glass substrates are used as the substrates 110A, damage might be more easily caused due to stress generated in the vicinities of the metal layers 111 sandwiching the conductive composite resins 121 at the time of heating and pressing, than in a case where substrates of an organic material having a relatively low elastic modulus are used.

In the circuit board 100C, if glass substrates are used as the substrates 110C, damage might be more easily caused due to stress generated in the vicinities of the metal layers 113 and the metal layers 111 in contact with each other or in the vicinities of the metal layers 113 in contact with one another at the time of heating and pressing, than in a case where substrates of an organic material are used.

In the circuit board 100B in which the upper and lower metal layers 111 are connected with vias that are the conductive composite resins 121 having a relatively low elastic modulus, on the other hand, even if glass substrates are used as the substrates 110B, damage such as the cracks 131 can be made smaller than that in the circuit board 100A and the circuit board 100C. However, the vias connecting the upper and lower metal layers 111 are the conductive composite resins 121 having a relatively high resistance value as described above. Therefore, even if electronic components are packaged at high density with glass substrates, preferable performance is hardly achieved, and as a result, it might become very difficult to obtain a high-performance electronic device or electronic apparatus.

In view of the above aspects, a structure described below as an embodiment is adopted to obtain a high-performance and high-reliability circuit board that excels in electrical characteristics and is capable of reducing damage such as cracks.

First, a first embodiment is described.

Here, a circuit board having a laminate structure formed with substrates (glass substrates) made of glass and substrates (resin substrates) made of resin is described as an example.

Figure 2A:
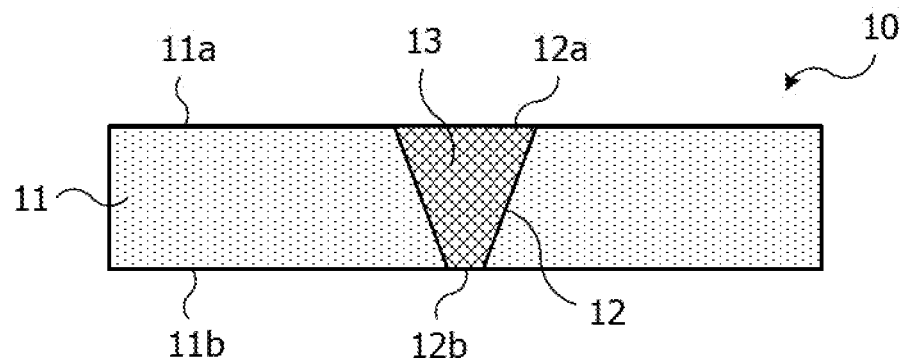
FIGS. 2A to 2C are explanatory views of an example of a circuit board according to a first embodiment.
Figure 2B:
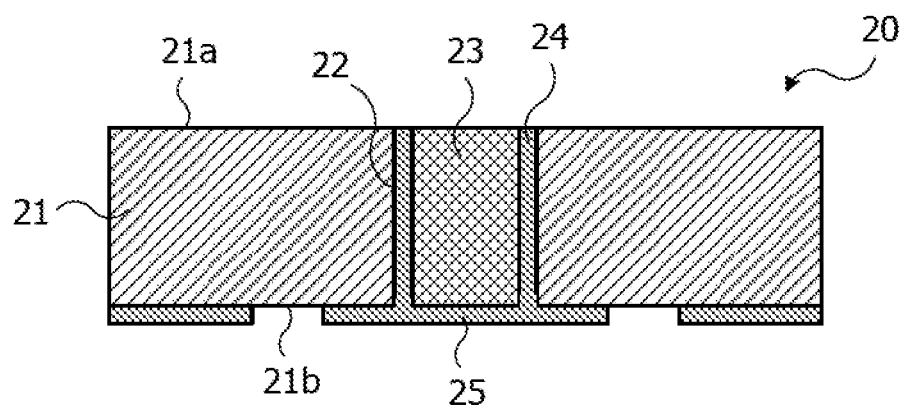
Figure 2C:
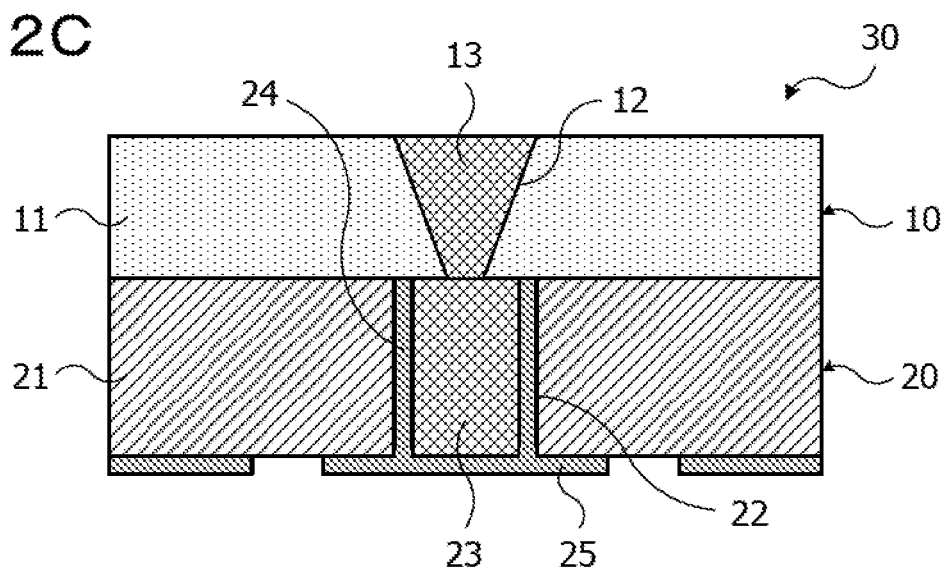
Figure 3:
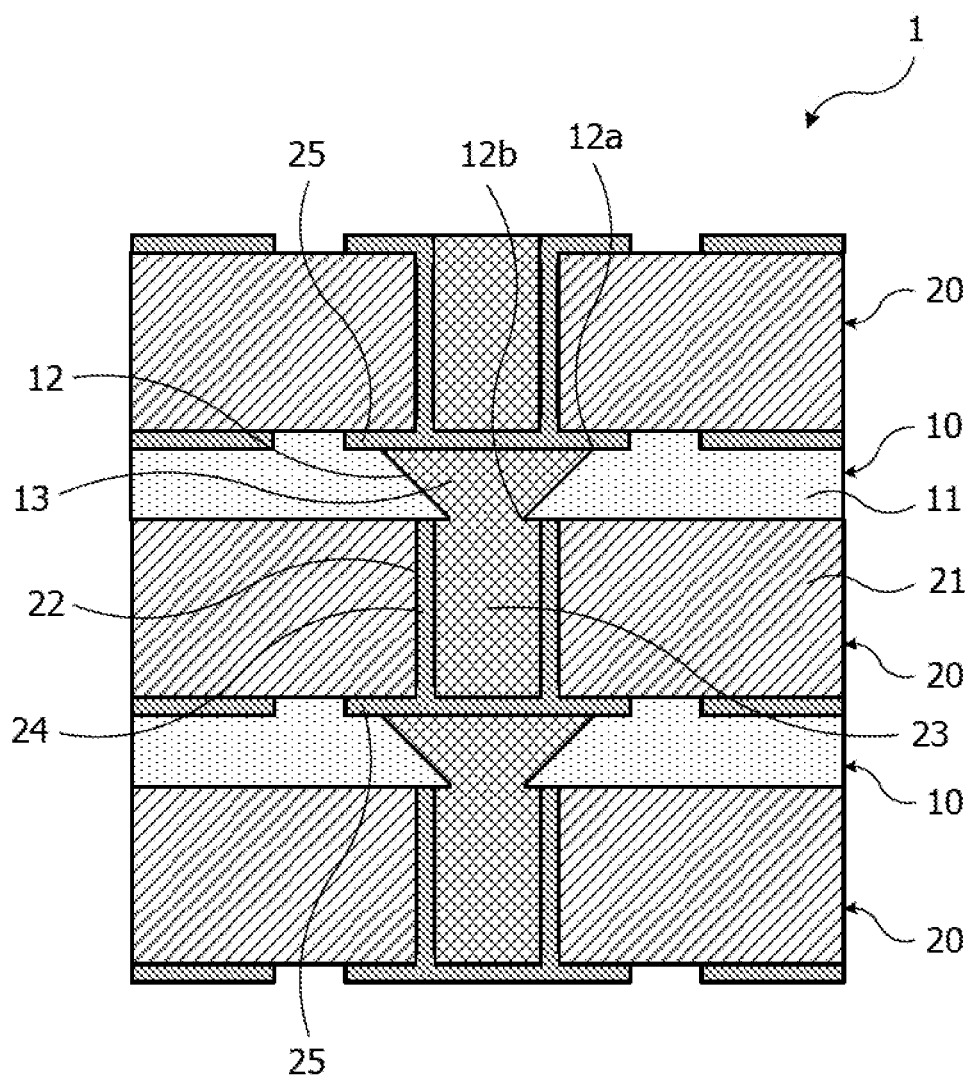
FIG. 3 is an explanatory view of the example of a circuit board according to the first embodiment.
Figure 4A:
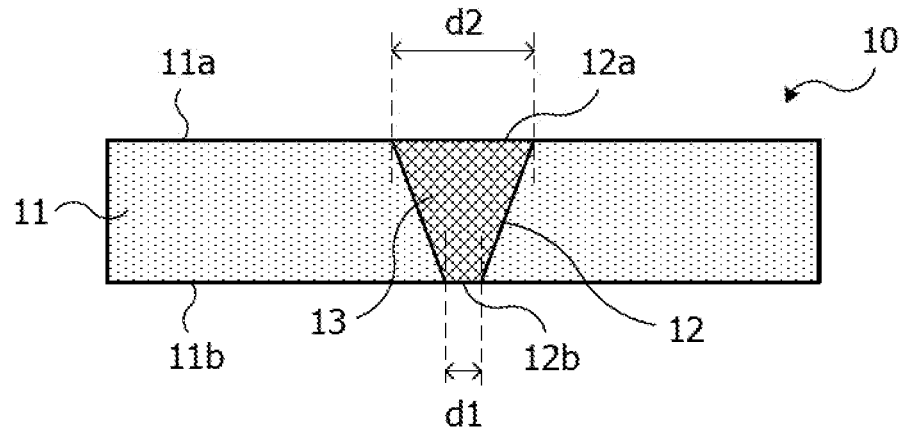
FIGS. 4A and 4B are explanatory views of the example of a circuit board according to the first embodiment.
Figure 4B:
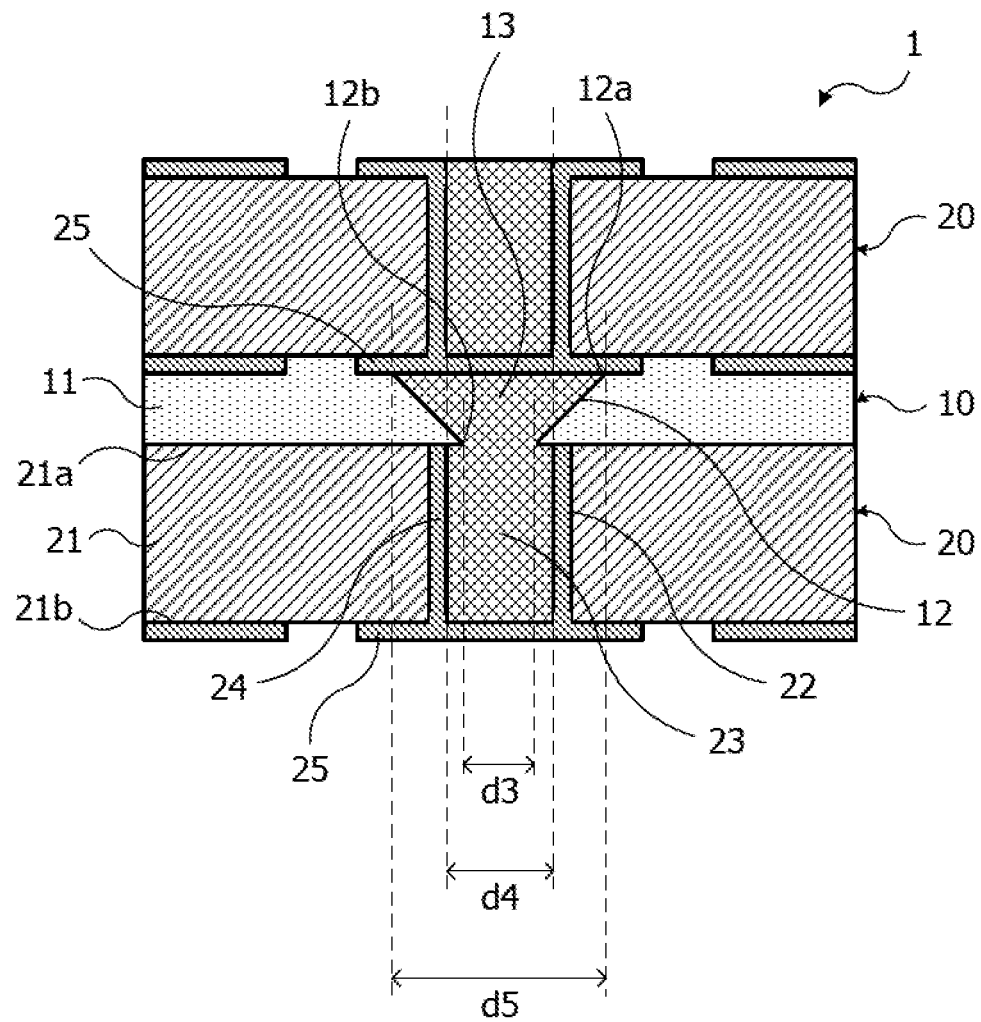

FIGS. 2A to 4B are explanatory views of an example of a circuit board according to the first embodiment. FIG. 2A schematically illustrates a cross-section of the relevant portion of an example of a resin substrate according to the first embodiment. FIG. 2B schematically illustrates a cross-section of the relevant portion of an example of a glass substrate according to the first embodiment. FIG. 2C schematically illustrates a cross-section of the relevant portion of an example of a substrate formed by bonding a resin substrate and a glass substrate to each other according to the first embodiment. FIG. 3 schematically illustrates a cross-section of the relevant portion of an example of a circuit board according to the first embodiment. FIGS. 4A and 4B are views for explaining the dimensions of the example of a circuit board according to the first embodiment.

A circuit board 1 (FIG. 3) includes resin substrates 10 illustrated in FIG. 3 and FIG. 2A, and glass substrates 20 illustrated in FIG. 3 and FIG. 2B.

As illustrated in FIG. 2A, a resin substrate 10 includes a resin layer 11, a through hole 12 penetrating the resin layer 11, and a conductive composite resin 13 provided in the through hole 12.

Various resin materials may be used for the resin layer 11. For example, a thermosetting resin such as epoxy resin, polyimide resin, or phenol resin is used for the resin layer 11. A thermoplastic resin such as polyethylene terephthalate (PET) resin or acrylonitrile-butadiene-styrene copolymer (ABS resin) may be used for the resin layer 11. Alternatively, a material formed by impregnating a reinforcing material such as glass fiber or glass cloth with one of various resin materials may be used for the resin layer 11.

The through hole 12 is formed to penetrate the resin layer 11 at a predetermined position. Here, a tapered through hole 12 in which the diameter of an open end 12b on the side of a surface 11b is smaller than the diameter of the open end 12a on the side of the other surface 11a is illustrated as an example. The shape, the dimensions, and the like of the through hole 12 will be described later in detail.

As for the conductive composite resin 13 provided in the through hole 12, a conductive paste in which a conductive filler is contained in a resin material is used. Various resin materials that are thermosetting resins such as epoxy resin or thermoplastic resins such as PET resin as described above are used for the conductive composite resin 13. As for the filler of the conductive composite resin 13, particles of one or more kinds of metal materials, or particles obtained by coating the surfaces of conductive or insulating core particles with one or more kinds of metal materials, or the like are used. Cu, silver (Ag), tin (Sn), bismuth (Bi), or the like is used as the metal material of such a filler. For example, a material having a lower elastic modulus than that of the material of the metal layers (a metal layer 24 and a metal layer 25 described later) provided on the glass substrate 20 is used as the conductive paste.

In the resin substrate 10, the conductive composite resin 13 provided in the tapered through hole 12 is used as the via of the resin substrate 10.

Meanwhile, as illustrated in FIG. 2B, the glass substrate 20 includes a glass layer 21, a through hole 22 penetrating the glass layer 21, a metal layer 24 formed on the inner wall of the through hole 22, and a conductive composite resin 23 provided on the inner side of the metal layer 24 of the through hole 22. The glass substrate 20 further includes a metal layer 25 that is provided on one surface 21b of the glass layer 21 and serves and lands and wiring lines.

As for the glass layer 21, various kinds of glass materials such as quartz glass, borosilicate glass, soda glass, or alkali free glass are used. The through hole 22 is provided to penetrate the glass layer 21 at a predetermined position. The through hole 22 is provided at the position corresponding to the through hole 12 provided in the resin layer 11 described above. The positional and dimensional relationship and the like between the through hole 22 provided in the glass layer 21 and the through hole 12 provided in the resin layer 11 will be described later.

Various kinds of metal materials, such as Cu, are used for the metal layer 24 formed on the inner wall of the through hole 22 of the glass layer 21 and the metal layer 25 provided on the surface 21b of the glass layer 21. The metal layer 24 and the metal layer 25 are formed by a technique such as plating or sputtering. Part (lands) of the metal layer 25 provided on the surface 21b of the glass layer 21 is provided to close one open end of the through hole 22, and this part of the metal layer 25 and the metal layer 24 on the inner wall of the through hole 22 are connected, to form a bottomed metal via.

A conductive paste is used as the conductive composite resin 23 provided on the inner side the metal layer 24 of the through hole 22. Various resin materials that are thermosetting resins such as epoxy resin or thermoplastic resins such as PET resin as described above are used for the conductive composite resin 23. As for the filler of the conductive composite resin 23, particles of one or more kinds of metal materials, or particles obtained by coating the surfaces of conductive or insulating core particles with one or more kinds of metal materials, or the like are used. Cu, Ag, Sn, Bi, or the like is used as the metal material of such a filler. For example, a material having a lower elastic modulus than that of the material of the metal layer 24 and the metal layer 25 is used as the conductive paste.

The conductive composite resin 23 is disposed in the bottomed metal via formed with the part of the metal layer 25 provided on the surface 21b of the glass layer 21 and the metal layer 24 on the inner wall of the through hole 22. One end face (the upper end face) of the conductive composite resin 23 is exposed on the side of a surface 21a of the glass layer 21.

In the glass substrate 20, the metal layer 24 on the inner wall of the through hole 22, the metal layer 25 on the surface 21b connected to the metal layer 24, and the conductive composite resin 23 provided on the inner side of the metal layer 24 of the through hole 22 are used as the via of the glass substrate 20.

The resin substrate 10 illustrated in FIG. 2A and the glass substrate 20 illustrated in FIG. 2B are bonded to each other so that the through hole 12 and the through hole 22 face each other as illustrated in FIG. 2C, for example, and a bonded substrate 30 is obtained. In the bonded substrate 30, the lower end face of the conductive composite resin 13 provided in the through hole 12 of the resin substrate 10 (the surface on the side of the open end 12b with the smaller diameter of the through hole 12) is located in the region on the inner side of the metal layer 24 formed on the inner wall of the through hole 22 of the glass substrate 20 (the region of the upper end face of the conductive composite resin 23).

Bonded substrates 30 as illustrated in FIG. 2C are stacked and are thermally pressed, so that the circuit board 1 illustrated in FIG. 3 is obtained. Alternatively, a plurality of resin substrates 10 as illustrated in FIG. 2A and a plurality of glass substrates 20 as illustrated in FIG. 2B may be alternately stacked so that the through holes 12 face the through holes 22, are be thermally pressed. In this manner, the circuit board 1 illustrated in FIG. 3 is obtained.

During this thermal pressing, each resin substrate 10 (the resin layer 11) interposed between upper and lower glass substrates 20 is pressed in the stacking direction, and the conductive composite resin 13 of the resin substrate 10 is connected to the metal layer 25 of the upper glass substrate 20 and to the conductive composite resin 23 of the lower glass substrate 20. The resin component contained in the conductive composite resins 13 of the resin substrates 10 and the resin component contained in the conductive composite resins 23 of the glass substrates 20 are melted by the thermal pressing and are thus integrated. The resin substrates 10 and the glass substrates 20 are electrically connected by the conductive fillers contained in the conductive composite resin 13 and the conductive composite resin 23, and the metal layers 24 and the metal layers 25 of the glass substrates 20.

Here, as illustrated in FIG. 4A, each resin substrate 10 has the through hole 12 in which the diameter d1 of the open end 12b facing the glass substrate 20 on the lower side is smaller than the diameter d2 of the open end 12a facing the glass substrate 20 on the upper side. Such a through hole 12 is filled with the conductive composite resin 13. At the time of thermal pressing, the open end 12a with the greater diameter d2 of the through hole 12 is made to face the surface 21b of the glass substrate 20 on the upper side, and the open end 12b with the smaller diameter d1 of the through hole 12 is made to face the surface 21a of the glass substrate 20 on the lower side, as illustrated in FIG. 4B. The conductive composite resin 13 provided in the through hole 12 of the resin substrate 10 is exposed to the surface 21a of the glass substrate 20 on the lower side, and is brought into contact with the conductive composite resin 23 on the inner side of the metal layer 24 formed on the inner wall of the through hole 22. Thus, the conductive composite resin 13 and the conductive composite resin 23 are melted and integrated.

The diameter d4 of the inner side (the conductive composite resin 23) of the metal layer 24 formed on the inner wall of the through hole 22 of each glass substrate 20 has a greater value than the diameter d1 (FIG. 4A) and the diameter d3 (FIG. 4B) of the open end 12b (the conductive composite resin 13) of the through hole 12 of the resin substrate 10 before and after the thermal pressing. As a result, at the time of thermal pressing, the open end 12b of the through hole 12 of the resin substrate 10 is located in the region on the inner side of the metal layer 24 of the glass substrate 20 on the lower side. At the time of thermal pressing, the conductive composite resin 13 provided in the through hole 12 of the resin substrate 10 is connected not to the metal layer 24 of the glass substrate 20 on the lower side, but to the conductive composite resin 23 on the inner side of the metal layer 24. The conductive composite resin 13 and the conductive composite resin 23 connected to each other have a relatively low elastic modulus. Any metal layer is not provided on the glass substrate 20 on the lower side at the position facing the metal layer 25 of the glass substrate 20 on the upper side. Therefore, the force that presses the conductive composite resin 13 is released toward the conductive composite resin 23 of the glass substrate 20 on the lower side and becomes weaker than in a case where thermal pressing is performed with the conductive composite resin 13 being interposed between the metal layer 25 and a metal layer facing the metal layer 25. With such a configuration of the resin substrate 10 and the glass substrates 20, the force to be applied to the metal layer 24 (and the metal layer 25 connected thereto) of the glass substrate 20 on the lower side during the thermal pressing, and the force to be applied to the metal layer 25 (and the metal layer 24 connected thereto) of the glass substrate 20 on the upper side during the thermal pressing are reduced.

Further, in the through hole 12 of the resin substrate 10, the diameter d2 of the open end 12a that faces the glass substrate 20 on the upper side prior to the thermal pressing has a greater value than the diameter d1 of the open end 12b that faces the glass substrate 20 on the lower side prior to the thermal pressing, as described above. Because of this, the connection area after the thermal pressing is secured between the conductive composite resin 13 provided in the through hole 12 of the resin substrate 10 and the metal layer 25 formed on the surface 21b of the glass substrate 20 on the upper side, and thus, increase in the resistance value can be reduced. In this case, the diameter d5 of the open end 12a (the conductive composite resin 13) of the through hole 12 of the resin substrate 10 after the thermal pressing preferably has a greater value than the diameter d4 of the inner side (the conductive composite resin 23) of the metal layer 24 formed on the inner wall of the through hole 22 of the glass substrate 20 on the upper side. With this arrangement, at the time of transmission of a high-frequency signal that is more likely to be transmitted not through the conductive composite resin 23 but through the metal layer 24 in the through hole 22 of each glass substrate 20, the high-frequency signal easily flows between the metal layer 24 and the conductive composite resin 13 of the resin substrate 10 via the metal layer 25. Thus, the transmission characteristics of the circuit board 1 are improved.

When the resin substrate 10 and the glass substrates 20 are thermally pressed, the conductive composite resin 13 of the resin substrate 10 is connected to the conductive composite resin 23 of the glass substrate 20 on the lower side, and the metal layer 24 and the metal layer 25 of the glass substrate 20 on the upper side are not brought into contact with the metal layer 24 and the metal layer 25 of the glass substrate 20 on the lower side, respectively. In this structure, the forces to be applied to the metal layers 24 and the metal layers 25 of the glass substrates 20 stacked on the upper and lower sides of the resin substrate 10 are reduced, even in a situation where the pressure at the time of thermal pressing is applied, and in a situation where the external force after the thermal pressing is applied. Thus, the stress to be generated in the via connecting portions (the conductive composite resin 13, the conductive composite resins 23, the metal layers 24, and the metal layers 25) between the resin substrate 10 and the glass substrates 20 on the upper and lower sides of the resin substrate 10 is reduced, and damage to the glass layers 21, such as cracks, is also reduced.

Further, the via of each glass substrate 20 includes not only the conductive composite resin 23 but also the metal layer 24 on the inner wall of the through hole 22. With this arrangement, the increase in the resistance value of the vias is reduced, and the increase in the resistance value of the via connecting portions (the conductive composite resins 13, the conductive composite resins 23, the metal layers 24, and the metal layers 25) in the circuit board 1 is also reduced.

With the above structure, the circuit board 1 with excellent performance and reliability is obtained.

Next, a method of forming the circuit board 1 having the above structure is described.

FIGS. 5A to 8B are explanatory views of an example of a method of forming a circuit board according to the first embodiment. FIGS. 5A to 5C, FIGS. 6A t to 6C, FIGS. 7A to 7C, and FIGS. 8A and 8B each schematically illustrates a cross-section of the relevant portion of each corresponding step of an example of circuit board formation according to the first embodiment.

Figure 5A:
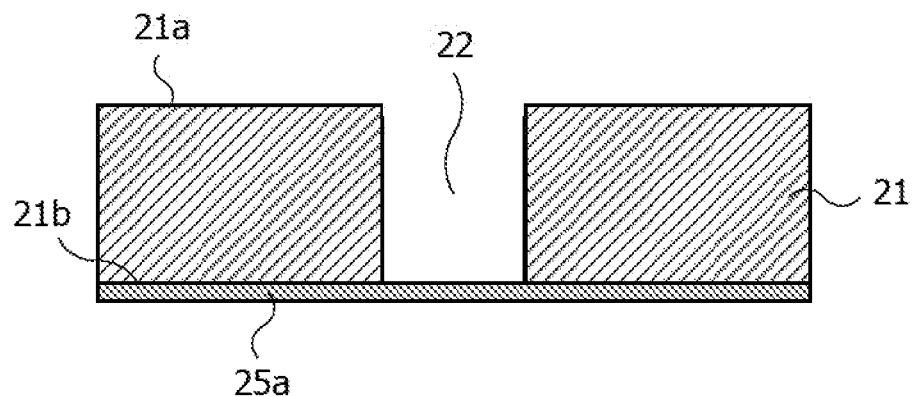
FIGS. 5A to 5C are views for explaining an example of a method of forming a circuit board according to the first embodiment.

First, as illustrated in FIG. 5A, a metal layer 25a is formed on one side or both sides of each glass layer 21. In this example, the metal layer 25a is formed on the surface 21b. For example, a seed layer is formed by electroless plating or sputtering on the surface 21b of each glass layer 21, and the metal layer 25a is formed by electrolytic plating using the seed layer as a feed layer. A Cu layer having a thickness of 5 μm, for example, is formed as the metal layer 25a. After the formation of the metal layer 25a, the through hole 22 is formed in the glass layer 21 as illustrated in FIG. 5A. The formation of the through hole 22 is performed by laser processing using a carbon dioxide ($CO_2$) laser, an excimer laser, or the like, etching, sandblasting, or drilling, for example. For example, a through hole 22 having a diameter of 80 μm is formed in the glass layer 21.

Figure 5B:
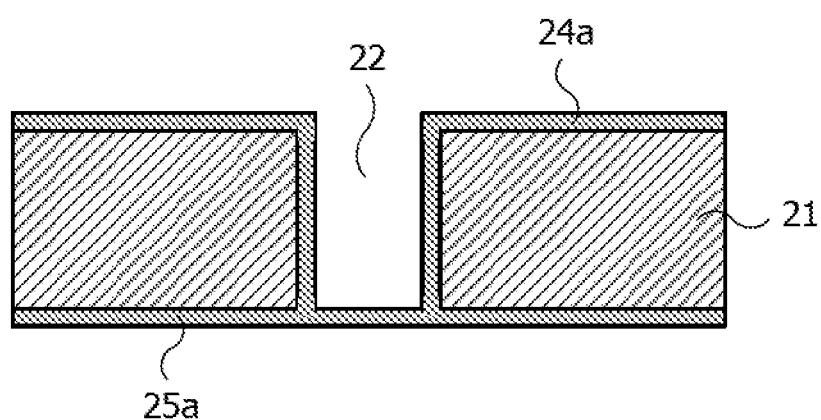

After the formation of the through hole 22, a metal layer 24a is formed on the surface 21a of the glass layer 21 and the inner wall of the through hole 22, as illustrated in FIG. 5B. Like the metal layer 25a, the metal layer 24a is formed by forming a seed layer by electroless plating or sputtering, and performing electrolytic plating using the seed layer. The metal layer 24a may also be formed on the already formed metal layer 25a. In this example, however, the metal layers formed on the upper and bottom surfaces of the glass layer 21 and in the through hole 22 are schematically illustrated as the metal layer 24a and the metal layer 25a, for convenience sake.

Figure 5C:
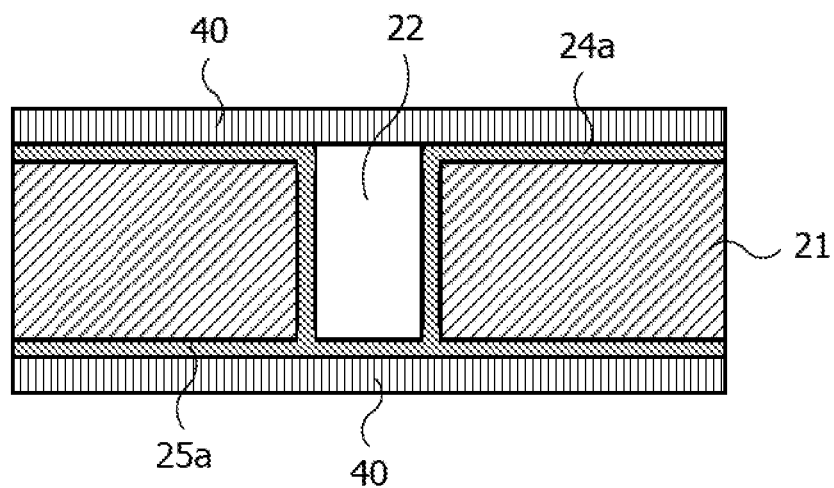

After the formation of the metal layer 24a, resists 40 are formed as illustrated in FIG. 5C. For example, dry film resists are bonded as the resists 40 to both surfaces of the glass layer 21.

Figure 6A:
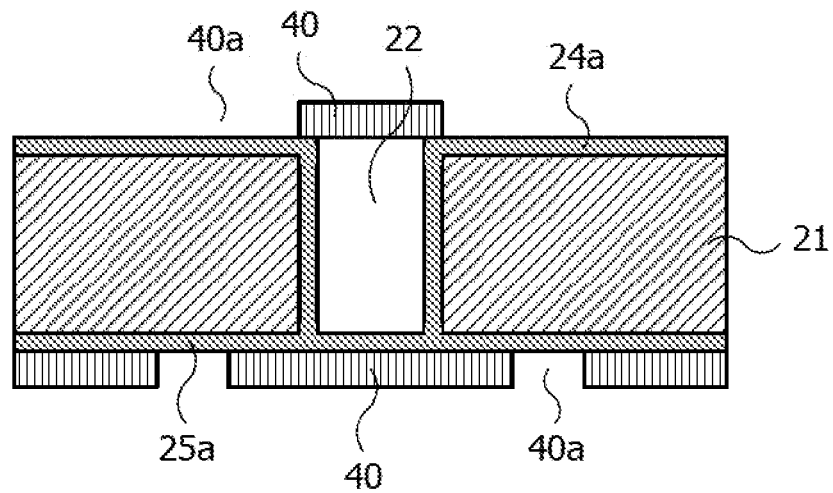
FIGS. 6A to 6C are views for explaining the example of a method of forming a circuit board according to the first embodiment.

After the formation of the resists 40, the resists 40 are subjected to exposure and development, so that openings 40a are formed in the regions from which the metal layer 24a and the metal layer 25a are to be removed, as illustrated in FIG. 6A.

Figure 6B:
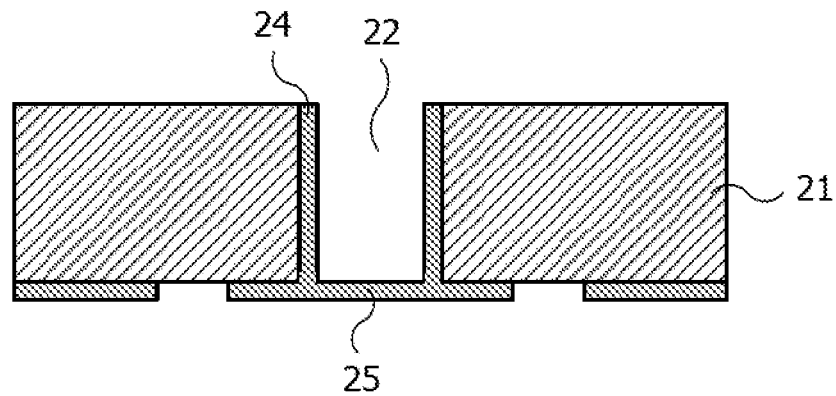

Patterning is performed on the metal layer 24a and the metal layer 25a through etching in which the resists 40 having the openings 40a formed therein are used as masks. As a result, the metal layer 24 serving as the via on the inner wall of the through hole 22, and the metal layer 25 serving as lands and wiring lines on the surface 21b are formed, as illustrated in FIG. 6B. After the formation of the metal layer 24 and the metal layer 25 by patterning, the resists 40 are removed.

Note that the metal layer 25 serving as lands and wiring lines may be formed not only on the surface 21b of the glass layer 21 but also on the surface 21a, as with the uppermost glass substrate 20 illustrated in FIGS. 8A and 8B described later.

Figure 6C:
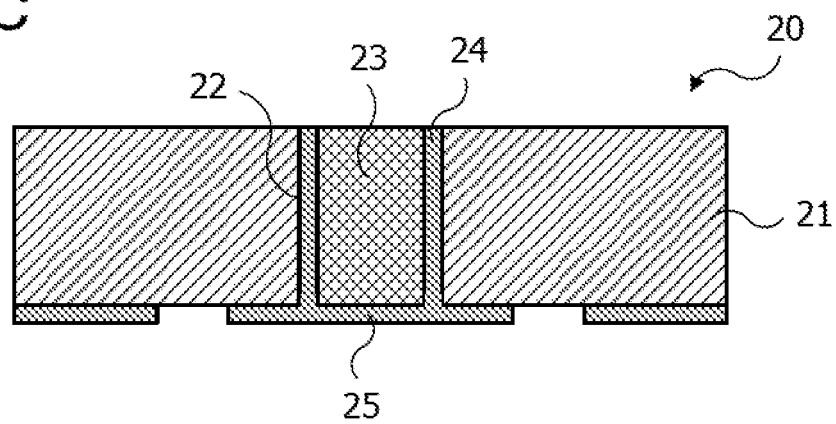

Next, printing of a conductive paste in which a conductive filler is contained in resin is performed, and, as illustrated in FIG. 6C, the inner side of the metal layer 24 formed on the inner wall of the through hole 22 of the glass layer 21 is filled with the conductive composite resin 23. As a result, the glass substrate 20 illustrated in FIG. 6C is formed.

Figure 7A:
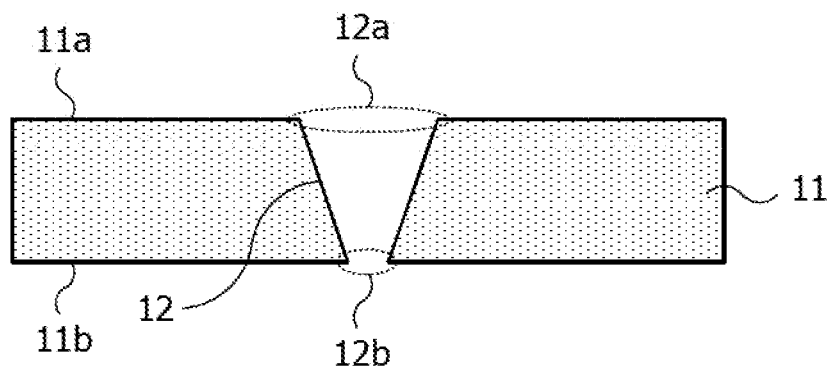
FIGS. 7A to 7C are views for explaining the example of a method of forming a circuit board according to the first embodiment.

Meanwhile, as illustrated in FIG. 7A, a through hole 12 is formed in each resin layer 11. For example, the diameter of one open end 12b of this through hole 12 is smaller than the diameter of the other open end 12a. The through hole 12 is formed by laser processing using a carbon dioxide laser or the like, for example.

Figure 7B:
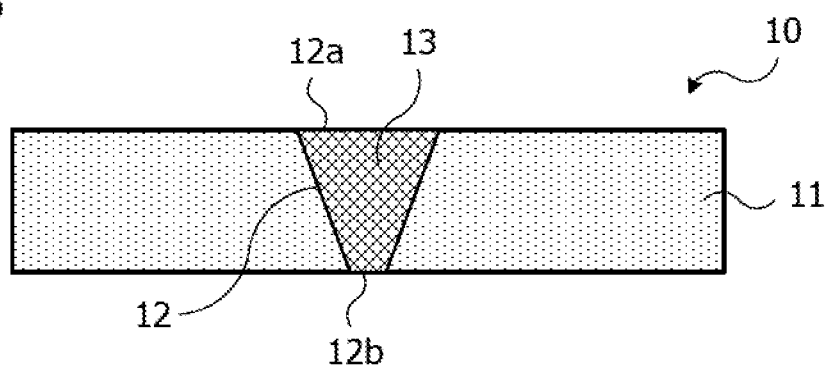

After the formation of the through hole 12, printing of a conductive paste is performed, and the through hole 12 in the resin layer 11 is filled with the conductive composite resin 13, as illustrated in FIG. 7B. Thus, the resin substrate 10 illustrated in FIG. 7B is formed.

Figure 7C:
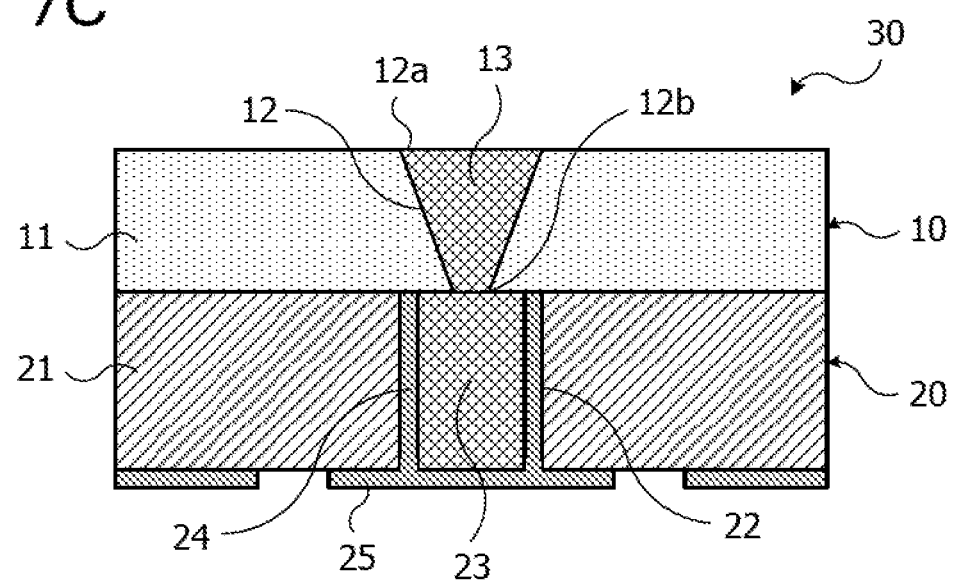

The glass substrate 20 and the resin substrate 10 formed as described above are aligned and bonded to each other so that the through hole 22 and the through hole 12 face each other, as illustrated in FIG. 7C. Thus, a bonded substrate 30 is formed. At this stage, the conductive composite resin 13 (on the side of the open end 12b having the smaller diameter of the through hole 12) provided in the through hole 12 of the resin substrate 10 is connected to the conductive composite resin 23 on the inner side of the metal layer 24 formed on the inner wall of the through hole 22 of the glass substrate 20. In the bonded substrate 30, however, the conductive composite resin 13 and the conductive composite resin 23 are not necessarily integrated, or are not necessarily melted and integrated.

Figure 8A:
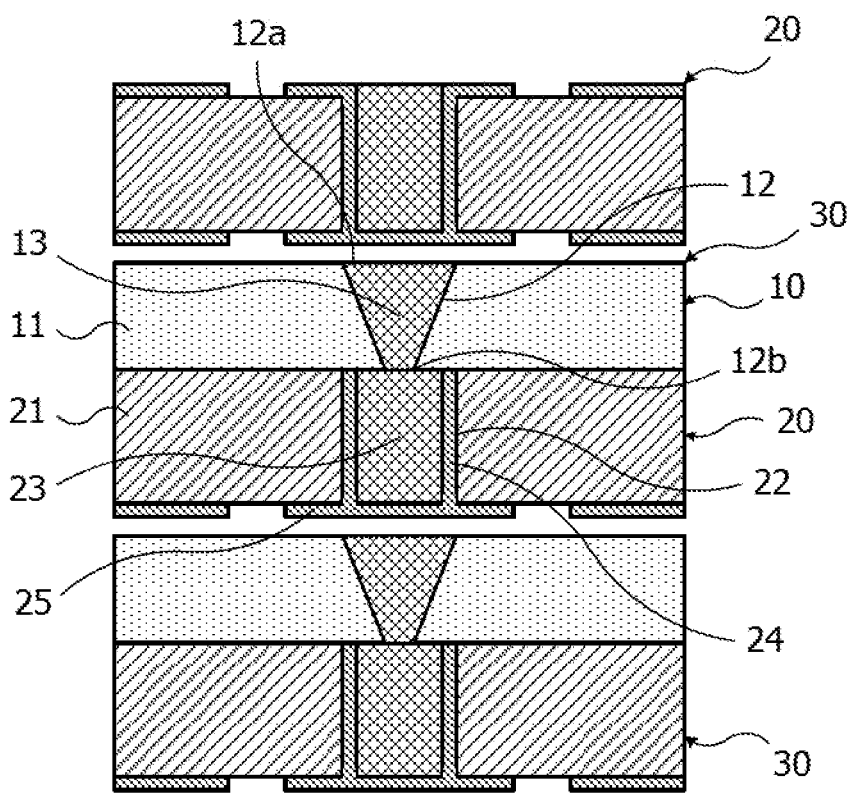
FIGS. 8A and 8B are views for explaining the example of a method of forming a circuit board according to the first embodiment.
Figure 8B:
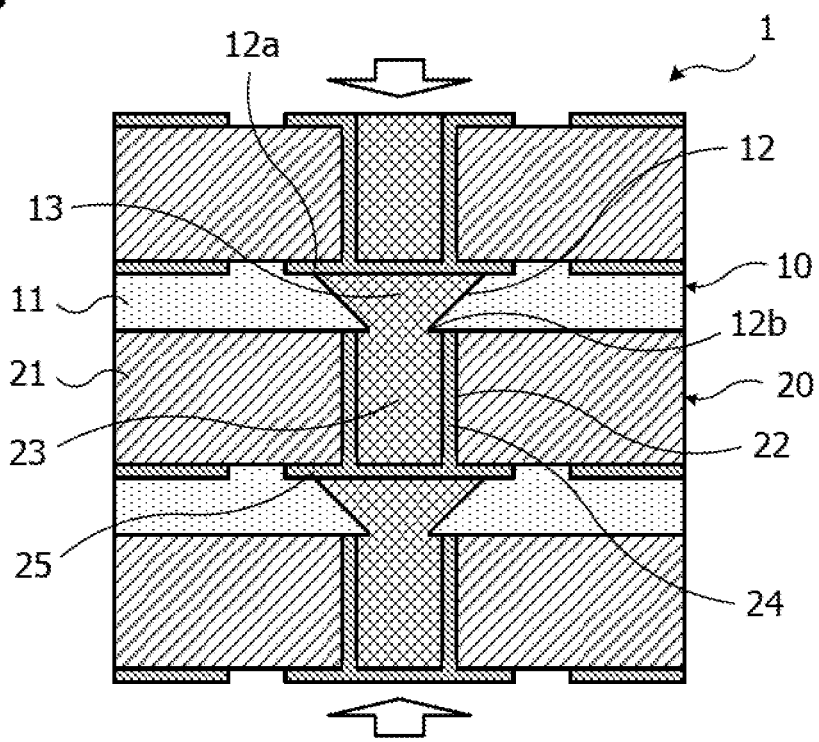

A plurality of (two in this example) bonded substrates 30 and the uppermost single glass substrate 20 (the metal layer 25 is formed on both surfaces of the glass layer 21 in this example) are stacked as illustrated in FIG. 8A, and are thermally pressed as illustrated in FIG. 8B. For example, the thermal pressing is performed under the conditions of 200° C., 90 minutes, and 30 kg/cm². By the thermal pressing, the resin component in the conductive composite resin 23 of the glass substrate 20 of each bonded substrate 30 and the resin component in the conductive composite resin 13 of the resin substrate 10 are melted, so that the conductive composite resin 13 and the conductive composite resin 23 are integrated and connected. Further, the melted conductive composite resin 13 of the resin substrate 10 is connected to the metal layer 25 of the glass substrate 20 stacked on the resin substrate 10. Thus, the circuit board 1 illustrated in FIG. 8B is formed.

In the circuit board 1, the conductive composite resin 13 of each resin substrate 10 is connected to the conductive composite resin 23 of the glass substrate 20 on the lower side, so that the forces to be applied to the metal layers 24 and the metal layers 25 of the upper and lower glass substrates 20 are reduced. Thus, the stress to be generated in the via connecting portions (the conductive composite resin 13, the conductive composite resins 23, the metal layers 24, and the metal layers 25) between the resin substrate 10 and the glass substrates 20 on the upper and lower sides of the resin substrate 10 is reduced, and damage to the glass layers 21, such as cracks, is reduced.

Next, the results of analysis of the circuit board 1 having the above structure are described.

Figure 9A:
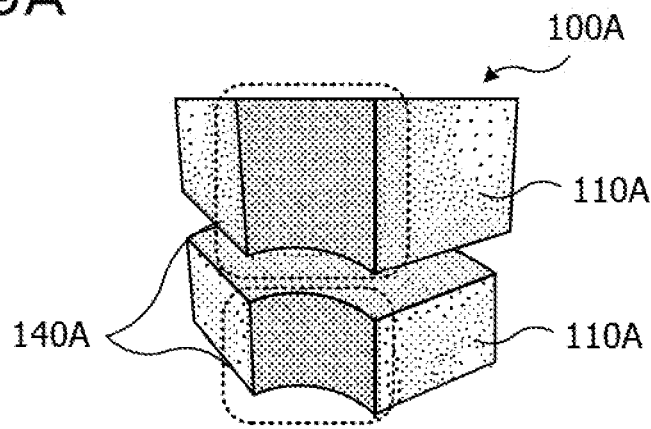
FIGS. 9A to 9C are views for explaining examples of the results of analysis of stress generated in glass substrates.
Figure 9B:
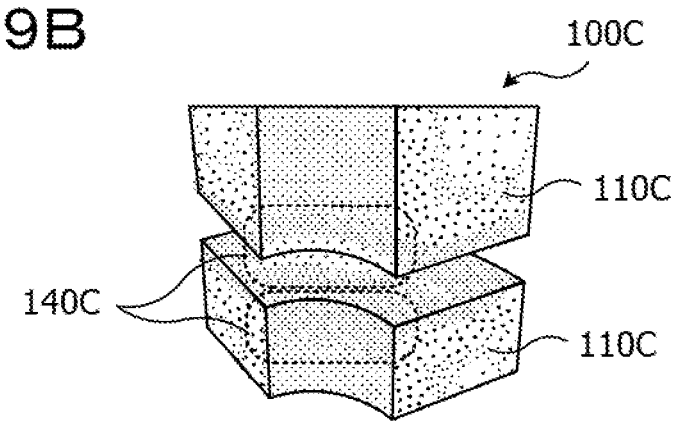
Figure 9C:
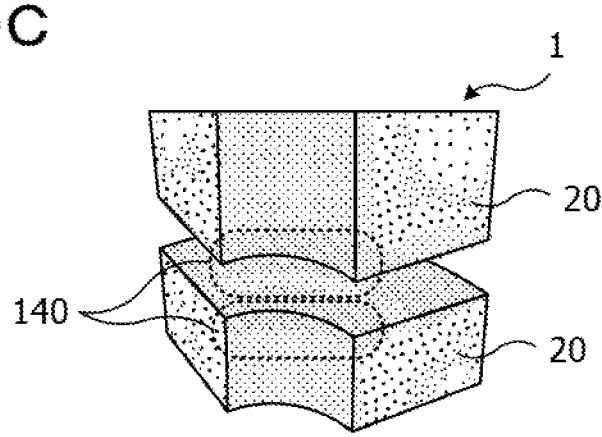
Figure 9C:
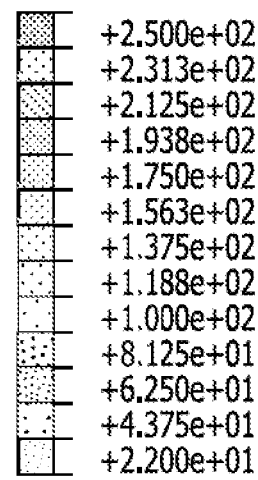

FIGS. 9A to 9C are views for explaining examples of the results of analysis of stress generated in glass substrates.

For comparison, FIG. 9A illustrates a result of stress analysis under the conditions for thermal pressing of the circuit board 100A illustrated in FIG. 1A described above. FIG. 9B illustrates a result of stress analysis under the conditions for thermal pressing of the circuit board 100C illustrated in FIG. 1C described above. FIG. 9C illustrates a result of stress analysis under the conditions for thermal pressing of the circuit board 1 according to the first embodiment illustrated in FIG. 3 described above. In the stress analysis, glass substrates are used as the substrates 110A of the circuit board 100A, and the substrates 110C of the circuit board 100C, as in the circuit board 1. Note that FIG. 9A illustrates only substrates 110A as upper and lower layers formed with glass substrates, FIG. 9B illustrates only substrates 110C as upper and lower layers formed with glass substrates, and FIG. 9C illustrates only glass substrates 20 as upper and lower layers.

As illustrated in FIG. 9A, in the circuit board 100A (FIG. 1A), a relatively high stress is generated over wide ranges in portions 140A of through holes in which filled vias 112 are formed in upper and lower substrates 110A formed with glass substrates. This is because the thermal expansion coefficient of the filled vias 112 is high, and the forces acting on the conductive composite resin 121 interposed and pressed between the metal layers 111 of the upper and lower substrates 110A are applied to the upper and lower metal layers 111 and the filled vias 112 connected to those metal layers 111, for example.

As illustrated in FIG. 9B, in the circuit board 100C (FIG. 1C), a relatively high stress is generated locally in portions 140C facing each other in upper and lower substrates 110C formed with glass substrates. This is because the metal layers 111 on the surfaces of the substrates 110C and the metal layers 113 on the inner wall of the through holes are continuously connected in a vertical direction, and therefore, the forces generated at the time of thermal pressing are applied to the metal layers 111 and the metal layers 113 that are contact with each other, for example.

As illustrated in FIG. 9C, in the circuit board 1 (FIG. 3) according to the first embodiment, on the other hand, the stress to be generated in portions 140 of glass substrates 20 is made lower, as compared with the circuit board 100A and the circuit board 100C. This is because, as described above, the conductive composite resin 13 of the resin substrate 10 interposed between the upper and lower glass substrates 20 is connected to the conductive composite resin 23 of the glass substrate 20 on the lower side, so that the forces to be applied to the metal layers 24 and the metal layers 25 of the upper and lower glass substrates 20 are reduced, for example.

As described above, in the circuit board 1, the stress to be generated in the glass substrates 20 is effectively reduced. Thus, damage such as cracks in the glass substrates 20 is reduced, and the circuit board 1 that excels in performance and reliability is obtained.

Figure 10:
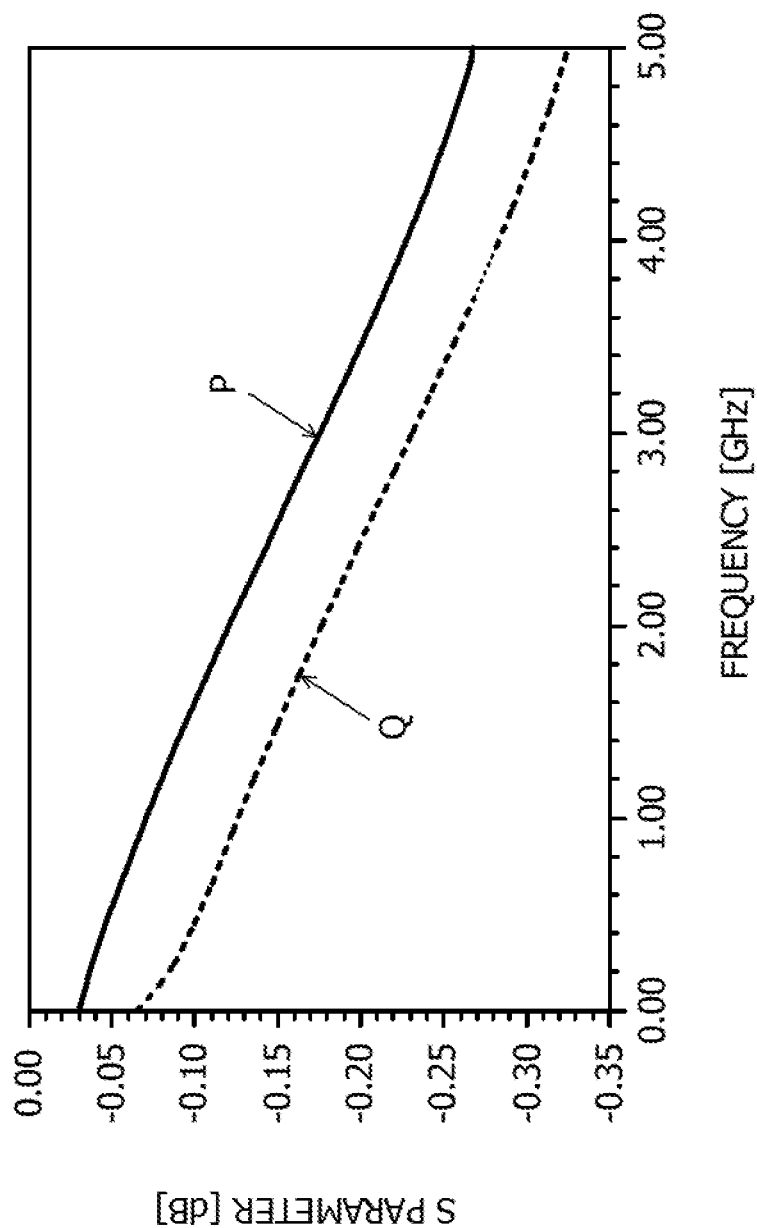
FIG. 10 is a graph illustrating an example of results of transmission characteristics analysis.

FIG. 10 is a graph illustrating an example of results of transmission characteristics analysis.

In FIG. 10, the result of analysis of the transmission characteristics of the circuit board 1 according to the first embodiment illustrated in FIG. 3 described above is indicated by a solid line P. In FIG. 10, the result of analysis of the transmission characteristics of the circuit board 100B illustrated in FIG. 1B described above is indicated by a dashed line Q, for comparison. In FIG. 10, the abscissa axis indicates frequency [GHz], and the ordinate axis indicates S parameter (log|S|) [dB].

As can be seen from FIG. 10, the transmission characteristics (the solid line P) of the circuit board 1 (FIG. 3) according to the first embodiment are preferable to the transmission characteristics (the dashed line Q) of a circuit board in which upper and lower metal layers 111 are connected only by the via of the conductive composite resin 121 as in the circuit board 100B (FIG. 1B). This is because the upper and lower metal layers 111 are connected only by the conductive composite resin 121 having a relatively high resistance value in the circuit board 100B, while the conductive composite resin 13 and the conductive composite resin 23 and the metal layer 24 are used to connect upper and lower metal layers 25 in the circuit board 1, or the like.

As described above, in the circuit board 1, preferred transmission characteristics are achieved, while the stress to be generated in the glass substrates 20 is reduced. Thus, the circuit board 1 that excels in performance and reliability is obtained.

Next, a second embodiment is described.

Figure 11A:
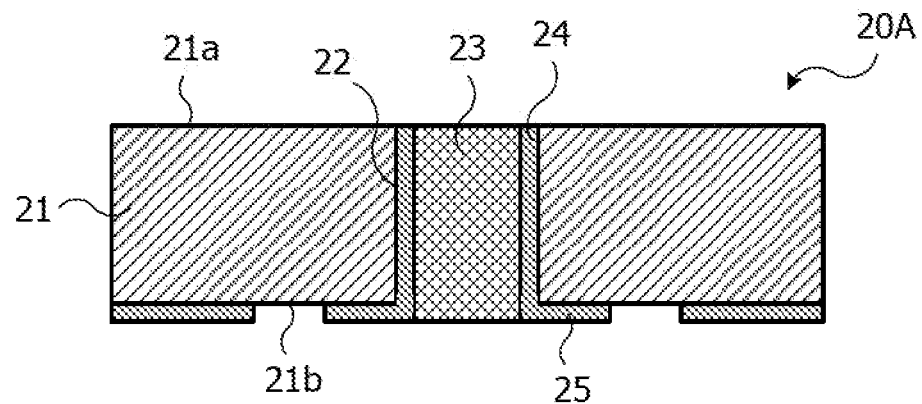
FIGS. 11A and 11B are explanatory views of an example of a circuit board according to a second embodiment.
Figure 11B:
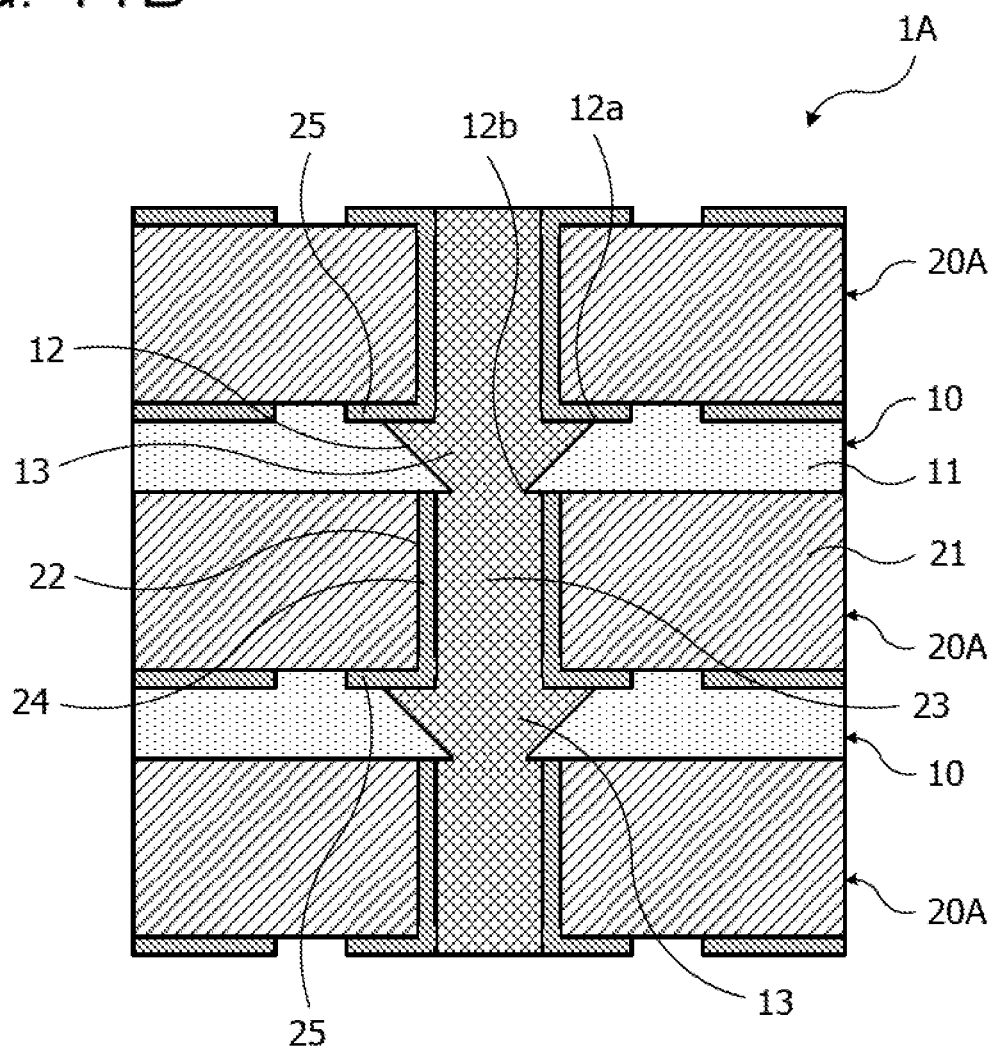

FIGS. 11A and 11B are explanatory views of an example of a circuit board according to the second embodiment. FIG. 11A schematically illustrates a cross-section of the relevant portion of an example of a glass substrate according to the second embodiment. FIG. 11B schematically illustrates a cross-section of the relevant portion of an example of a circuit board according to the second embodiment.

A glass substrate 20A illustrated in FIG. 11A has a structure in which the upper end face and the lower end face of the conductive composite resin 23 provided on the inner side of the metal layer 24 of the through hole 22 are exposed on the side of the surface 21a and on the side of the surface 21b of the glass layer 21, respectively. For example, this glass substrate 20A differs from each glass substrate 20 described in the first embodiment, in that the lower end face of the conductive composite resin 23 is not closed by the metal layer 25, for example.

Glass substrates 20A like the glass substrate 20A illustrated in FIG. 11A and resin substrates 10 (FIG. 2A and others) are alternately stacked and are then thermally pressed, so that a circuit board 1A illustrated in FIG. 11B is obtained. At the time of thermal pressing, the conductive composite resin 13 of each resin substrate 10 is connected to the conductive composite resin 23 on the inner side of the metal layer 24 exposed on the side of the surface 21a of the glass substrate 20A on the lower side, and to the conductive composite resin 23 exposed on the side of the surface 21b and the metal layer 25 of the glass substrate 20A on the upper side. The conductive composite resin 13 and the conductive composite resin 23 that are connected are melted and integrated.

As described above, in the circuit board 1A, the conductive composite resin 13 of each resin substrate 10 is connected to the conductive composite resin 23 of the glass substrate 20A on the lower side, and is connected to the conductive composite resin 23 of the glass substrate 20A on the upper side. The conductive composite resin 13 and the conductive composite resin 23 having a relatively low elastic modulus are continuously connected in the stacking direction (a vertical direction), and the forces to be applied to the metal layer 24 and the metal layer 25 from the conductive composite resin 13 and the conductive composite resin 23 are reduced. Thus, the stress to be generated in the via connecting portions (the conductive composite resin 13, the conductive composite resins 23, the metal layers 24, and the metal layers 25) between the resin substrate 10 and the glass substrates 20A on the upper and lower sides of the resin substrate 10 is reduced, and damage to the glass layers 21, such as cracks, is also reduced.

Further, as each glass substrate 20A includes the metal layer 24 having a relatively low resistance value in the via, the increase in the resistance value of the via connecting portions (the conductive composite resins 13, the conductive composite resins 23, the metal layers 24, and the metal layers 25) in the circuit board 1A is reduced.

With the above structure, the circuit board 1A that excels in performance and reliability is obtained.

Next, a third embodiment is described.

FIGS. 12A to 15B are explanatory views of an example of a method of forming a circuit board according to the third embodiment. FIGS. 12A to 12C, FIGS. 13A to 13C, FIGS. 14A to 14C, and FIGS. 15A and 15B each schematically illustrates a cross-section of the relevant portion of each corresponding step of an example of circuit board formation according to the third embodiment.

Figure 12A:
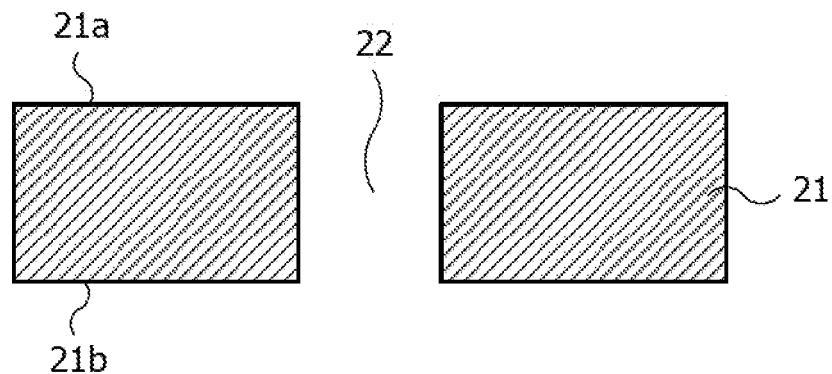
FIGS. 12A to 12C are views for explaining an example of a method of forming a circuit board according to a third embodiment.

First, as illustrated in FIG. 12A, a through hole 22 is formed in each glass layer 21. The through hole 22 is formed by laser processing using a carbon dioxide laser or the like.

Figure 12B:
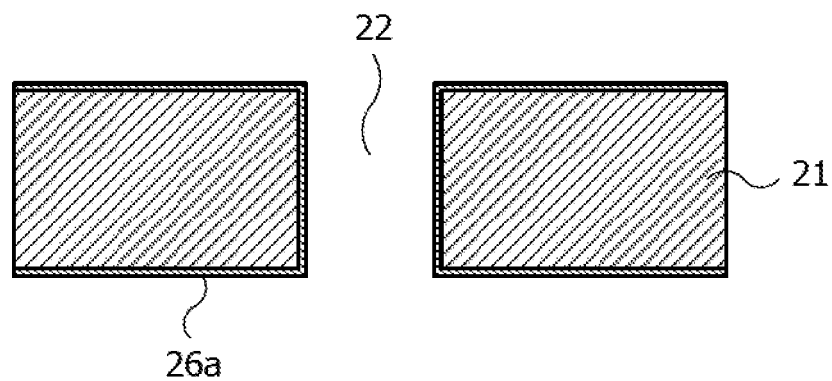

After the formation of the through hole 22, a seed layer 26a is formed on the surface 21a and the surface 21b of the glass layer 21 and on the inner wall of the through hole 22 by electroless plating or sputtering, as illustrated in FIG. 12B.

Figure 12C:
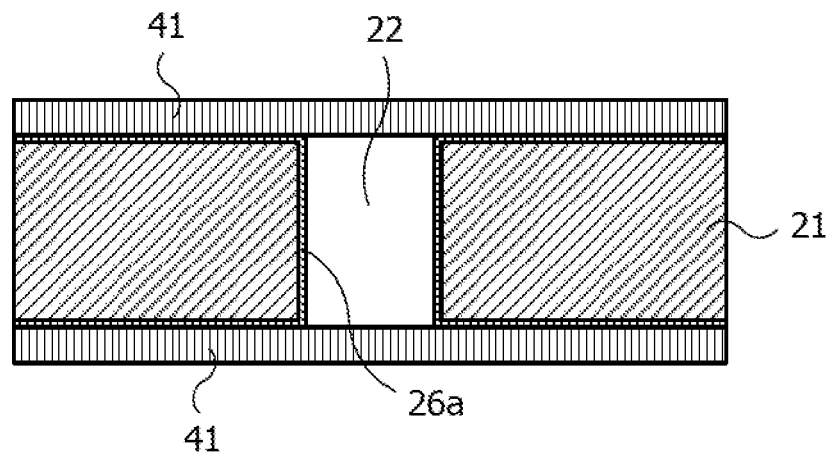

After the formation of the seed layer 26a, resists 41 are formed as illustrated in FIG. 12C. For example, dry film resists are bonded as the resists 41 to both surfaces of the glass layer 21.

Figure 13A:
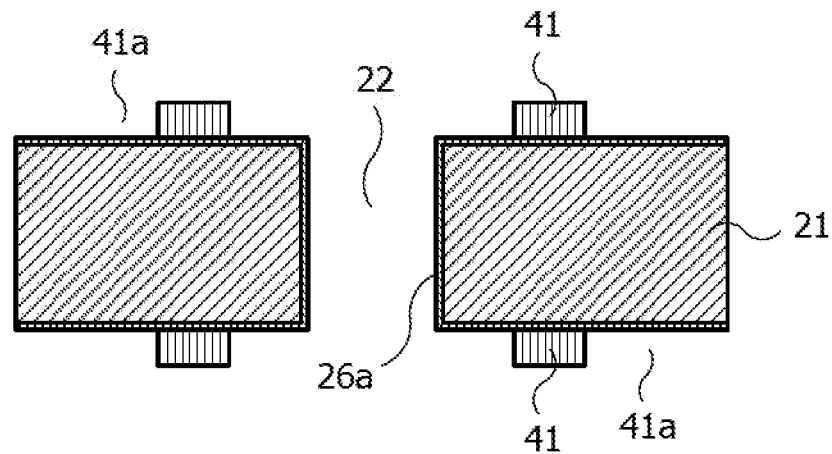
FIGS. 13A to 13C are views for explaining the example of a method of forming a circuit board according to the third embodiment.

After the formation of the resists 41, the resists 41 are subjected to exposure and development, so that openings 41a are formed in the regions in which a metal layer 24 and a metal layer 25 are to be formed, as illustrated in FIG. 13A.

Figure 13B:
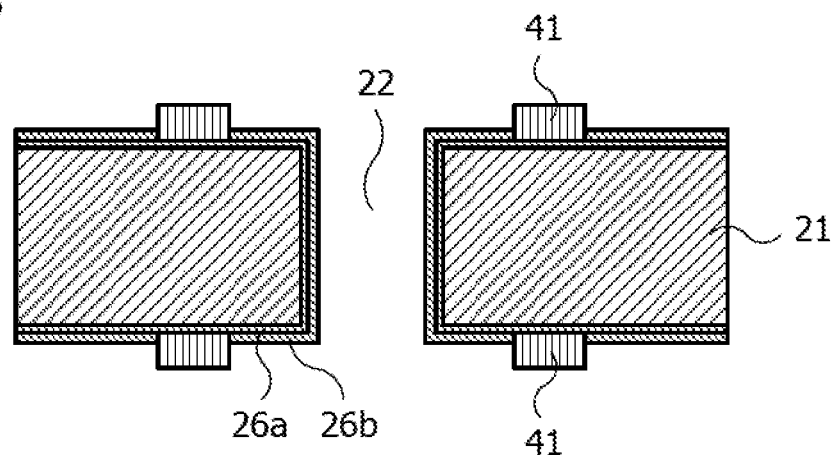

Next, as illustrated in FIG. 13B, a metal layer 26b is formed on the seed layer 26a exposed through the resists 41 by electrolytic plating using the seed layer 26a as a feed layer.

Figure 13C:
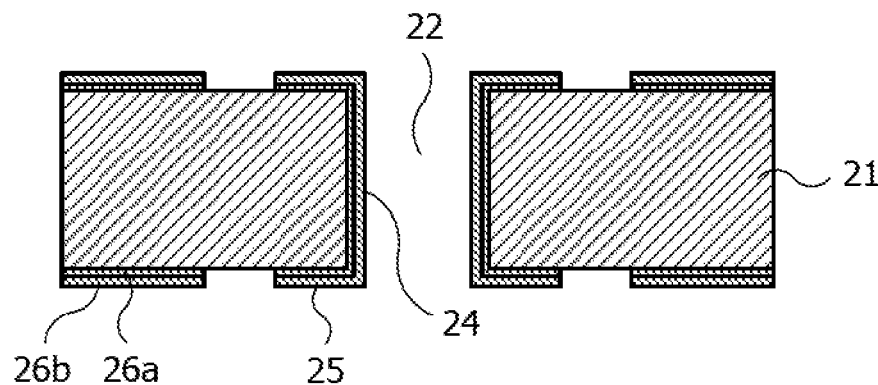

After the formation of the metal layer 26b, the resists 41 are removed, and the seed layer 26a that is exposed after the removal of the resists 41 is removed by etching, as illustrated in FIG. 13C. As a result, the metal layer 24 is formed on the inner wall of the through hole 22, and the metal layer 25 is formed on the surface 21a and the surface 21b of the glass layer 21.

Alternatively, after the formation of the seed layer 26a as illustrated in FIG. 12B, the metal layer 26b may be formed by electrolytic plating, and predetermined portions of the seed layer 26a and the metal layer 26b may be removed by etching, so that the metal layer 24 and the metal layer 25 are formed as illustrated in FIG. 13C.

Figure 14A:
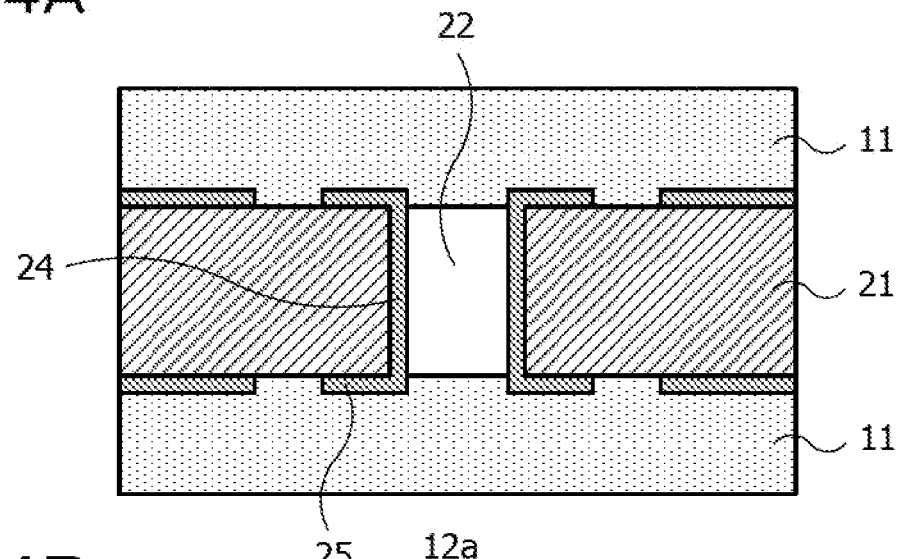
FIGS. 14A to 14C are views for explaining the example of a method of forming a circuit board according to the third embodiment.

After the formation of the metal layer 24 and the metal layer 25, resin layers 11 are formed as illustrated in FIG. 14A. For example, resin films are bonded as the resin layers 11 to both surfaces of the glass layer 21.

Figure 14B:
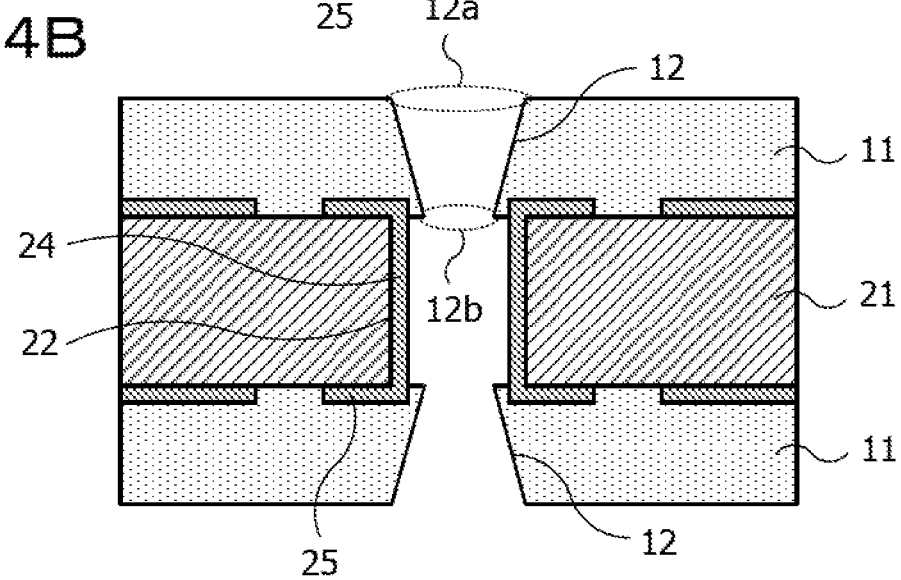

After the formation of the resin layers 11, tapered through holes 12 are formed in the resin layers 11 at the positions corresponding to the through hole 22 of the glass layer 21, so that the diameter of each open end 12b on the side of the glass layer 21 becomes smaller than that of the open end 12a on the opposite side, as illustrated in FIG. 14B. The through holes 12 are formed by laser processing using a carbon dioxide laser or the like.

Figure 14C:
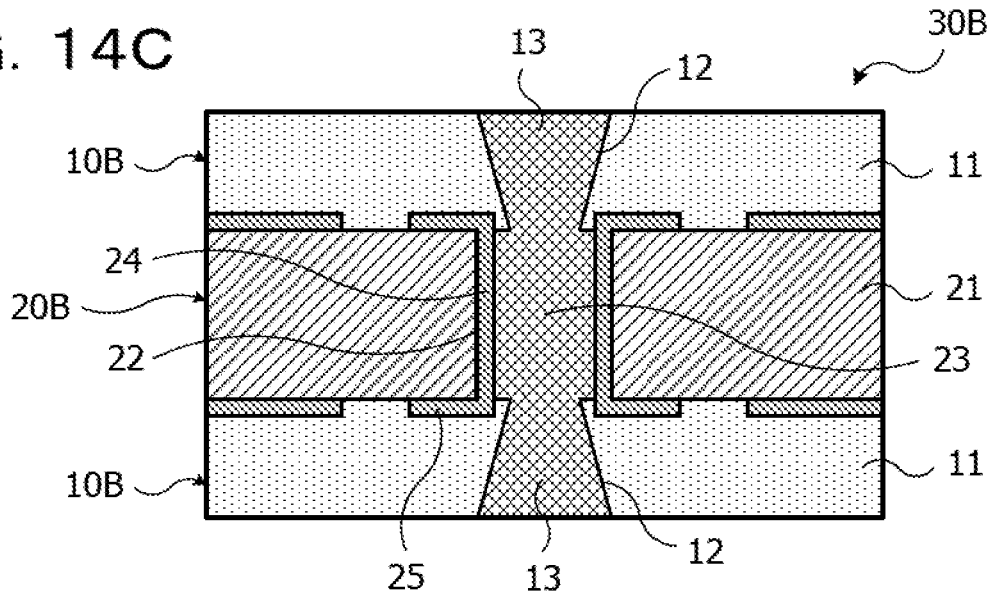

After the formation of the through holes 12, printing of a conductive paste in which a conductive filler is contained in resin is performed, and, as illustrated in FIG. 14C, the through holes 12 of the resin layers 11 and the inner side of the metal layer 24 formed on the inner wall of the through hole 22 of the glass layer 21 are filled with the conductive paste. As a result, conductive composite resins 13 are formed in the through holes 12 of the resin layers 11, and a conductive composite resin 23 is formed on the inner side of the metal layer 24 formed on the inner wall of the through hole 22 of the glass layer 21.

Through the steps as described above, a substrate (a bonded substrate) 30B in which resin substrates 10B are formed on both surfaces of a glass substrate 20B is formed, as illustrated in FIG. 14C. The glass substrate 20B includes the glass layer 21 having the through hole 22, the metal layer 24 formed on the inner wall of the through hole 22, the conductive composite resin 23 provided on the inner side of the metal layer 24 of the through hole 22, and the metal layer 25 formed on the surface 21a and the surface 21b of the glass layer 21. The resin substrates 10B each include the resin layer 11 having the through hole 12, and the conductive composite resin 13 provided in the through hole 12. In the bonded substrate 30B, the conductive composite resin 23 of the glass substrate 20B and the conductive composite resins 13 of the resin substrates 10B are integrally formed.

Further, through the above example of the steps, bonded substrates 30B in which a resin substrate 10B is provided on one surface of each glass substrate 20B are obtained.

Figure 15A:
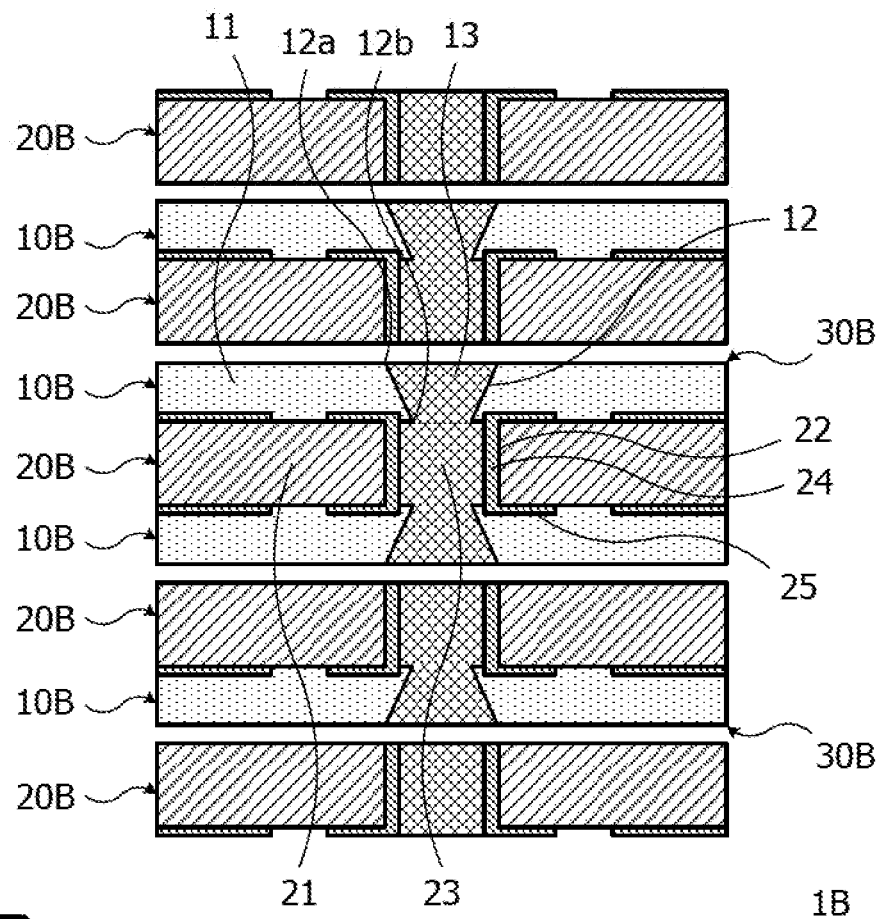
FIGS. 15A and 15B are views for explaining the example of a method of forming a circuit board according to the third embodiment.
Figure 15B:
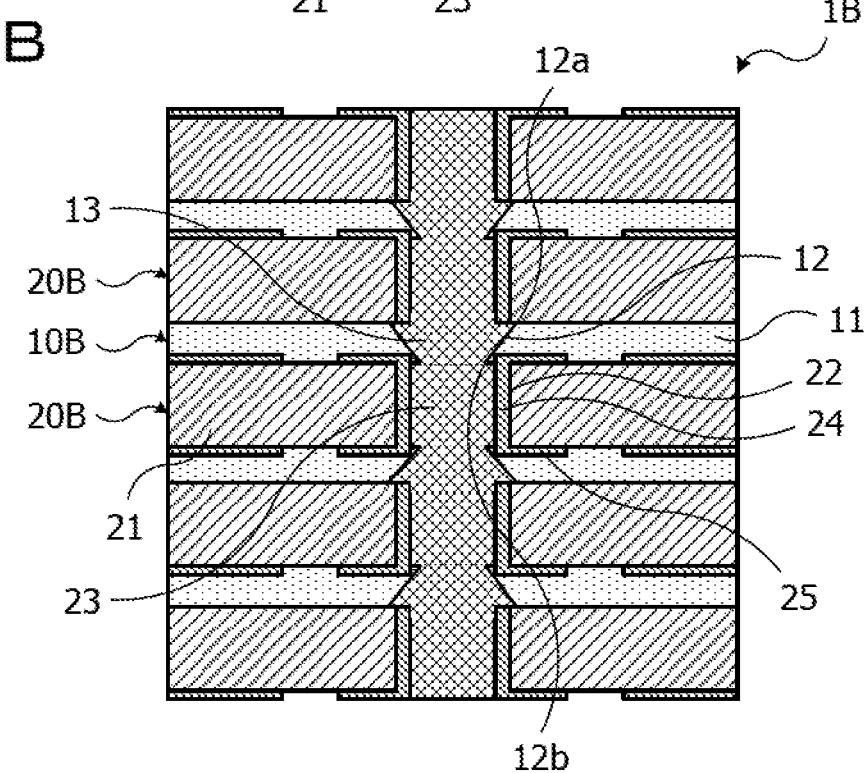

Bonded substrates 30B each having resin substrates 10B or a resin substrate 10B formed on both surfaces or one surface of a glass substrate 20B, and the uppermost and the lowermost glass substrates 20B (glass substrates each having a metal layer 25 on one surface of the corresponding glass layer 21 in this example) are stacked as illustrated in FIG. 15A, and are thermally pressed as illustrated in FIG. 15B. For example, the thermal pressing is performed under the conditions of 200° C., 90 minutes, and 30 kg/cm². By thermal pressing, the resin components in the conductive composite resins 23 and the resin components in the conductive composite resins 13 are melted and integrated, and are thus connected. In this manner, a circuit board 1B illustrated in FIG. 15B is formed.

In the circuit board 1B, the conductive composite resin 13 of each resin substrate 10B is connected to the conductive composite resin 23 of the glass substrate 20B on the lower side, so that the forces to be applied to the metal layers 24 and the metal layers 25 of the upper and lower glass substrates 20B are reduced. Thus, the stress to be generated in the via connecting portions (the conductive composite resin 13, the conductive composite resins 23, the metal layers 24, and the metal layers 25) between each resin substrate 10B and the glass substrates 20B is reduced, and damage to the glass layers 21, such as cracks, is reduced.

Further, as each glass substrate 20B includes the metal layer 24 having a relatively low resistance value in the via, the increase in the resistance value of the via connecting portions (the conductive composite resins 13, the conductive composite resins 23, the metal layers 24, and the metal layers 25) in the circuit board 1B is reduced.

With the above structure, the circuit board 1B that excels in performance and reliability is obtained.

Next, a fourth embodiment is described.

Modifications of resin substrates are described herein as the fourth embodiment.

Figure 16A:
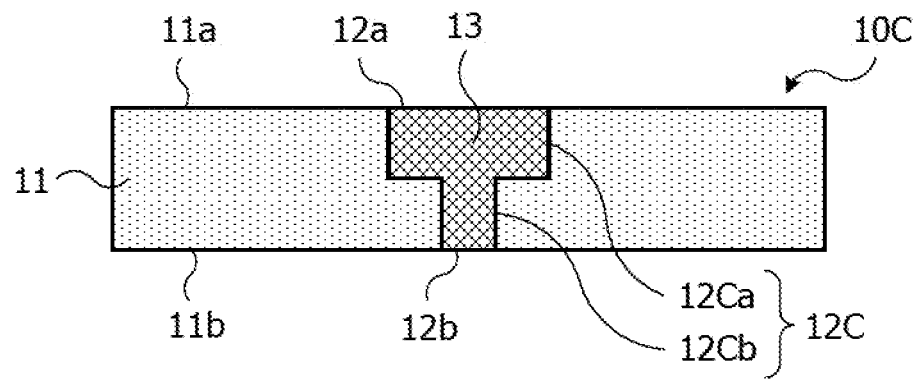
FIGS. 16A to 16C are explanatory views of examples of resin substrates according to a fourth embodiment.
Figure 16B:
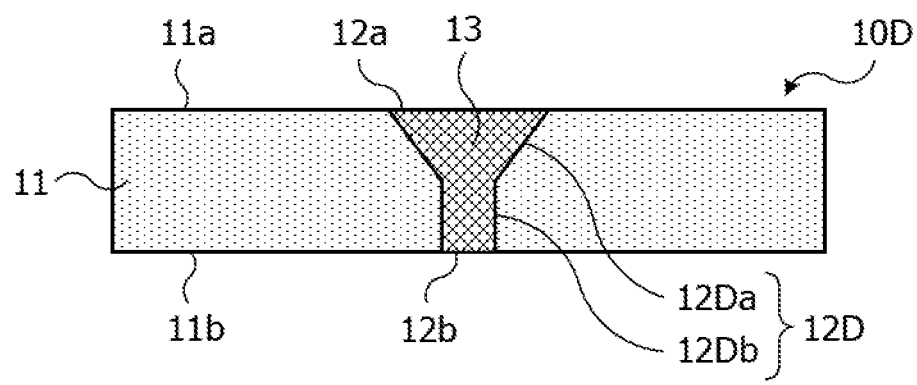
Figure 16C:
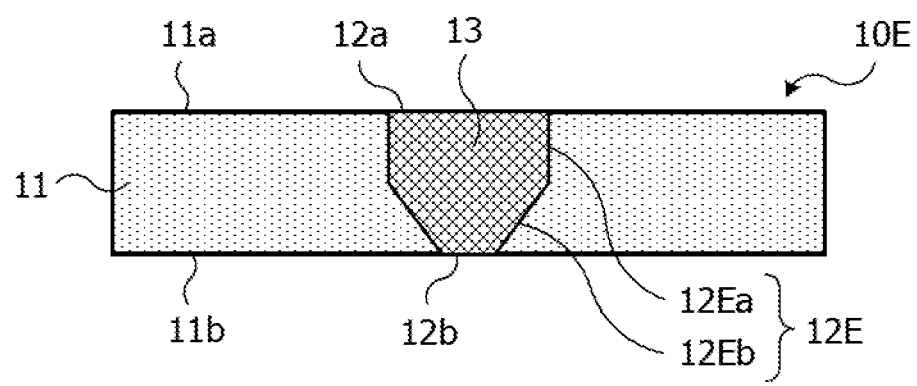

FIGS. 16A to 16C are explanatory views of examples of resin substrates according to the fourth embodiment. FIG. 16A schematically illustrates a cross-section of the relevant portion of a first example of a resin substrate according to the fourth embodiment. FIG. 16B schematically illustrates a cross-section of the relevant portion of a second example of a resin substrate according to the fourth embodiment. FIG. 16C schematically illustrates a cross-section of the relevant portion of a third example of a resin substrate according to the fourth embodiment.

A resin substrate 10C illustrated in FIG. 16A has a through hole 12C that includes a hole 12Ca that is formed in the upper portion on the side of the surface 11a of the resin layer 11 and has a fixed diameter, and a hole 12Cb that is formed in the lower portion on the side of the surface 11b of the resin layer 11, communicates with the hole 12Ca, and has a smaller fixed diameter than that of the hole 12Ca. This through hole 12C is filled with a conductive composite resin 13. The side of the surface 11b (the side of the open end 12b) provided with the hole 12Cb of the through hole 12C is made to face the side of the surface 21a of one of the above described glass substrates 20, 20A, and 20B. The through hole 12C is formed at the position corresponding to the through hole 22 of the glass substrate 20, 20A, or 20B. The diameter of the hole 12Cb (the open end 12b) is smaller than the inner diameter of the metal layer 24 (or the outer diameter of the conductive composite resin 23 provided on the inner side of the metal layer 24) formed on the inner wall of the through hole 22 of the glass substrate 20, 20A, or 20B.

A resin substrate 10D illustrated in FIG. 16B has a through hole 12D that includes a tapered hole 12Da that is formed in the upper portion on the side of the surface 11a of the resin layer 11, and a hole 12Db that is formed in the lower portion on the side of the surface 11b of the resin layer 11, communicates with the hole 12Da, and has a fixed diameter. The hole 12Da is formed such that its diameter becomes smaller in a downward direction, and the hole 12Db continues from the hole 12Da and has a fixed diameter. Such a through hole 12D is filled with a conductive composite resin 13. The side of the surface 11b (the side of the open end 12b) provided with the hole 12Db of the through hole 12D is made to face the side of the surface 21a of one of the above described glass substrates 20, 20A, and 20B. The through hole 12D is formed at the position corresponding to the through hole 22 of the glass substrate 20, 20A, or 20B. The diameter of the hole 12Db (the open end 12b) is smaller than the inner diameter of the metal layer 24 (or the outer diameter of the conductive composite resin 23 provided on the inner side of the metal layer 24) formed on the inner wall of the through hole 22 of the glass substrate 20, 20A, or 20B.

A resin substrate 10E illustrated in FIG. 16C has a through hole 12E that includes a hole 12Ea that is formed in the upper portion on the side of the surface 11a of the resin layer 11 and has a fixed diameter, and a tapered hole 12Eb that is formed in the lower portion on the side of the surface 11b of the resin layer 11 and communicates with the hole 12Ea. The diameter of the hole 12Eb decreases in a downward direction continuously from the hole 12Ea. Such a through hole 12E is filled with a conductive composite resin 13. The side of the surface 11b (the side of the open end 12b) provided with the hole 12Eb of the through hole 12E is made to face the side of the surface 21a of one of the above described glass substrates 20, 20A, and 20B. The through hole 12E is formed at the position corresponding to the through hole 22 of the glass substrate 20, 20A, or 20B. The diameter of the hole 12Eb (the open end 12b) is smaller than the inner diameter of the metal layer 24 (or the outer diameter of the conductive composite resin 23 provided on the inner side of the metal layer 24) formed on the inner wall of the through hole 22 of the glass substrate 20, 20A, or 20B.

Such resin substrates 10C, resin substrates 10D, or resin substrates 10E, and the glass substrates 20, the glass substrates 20A, or the glass substrates 20B described above may be stacked, to form a circuit board. Even in a case where the resin substrates 10C, the resin substrates 10D, or the resin substrates 10E are used, the stress to be generated in the via connecting portions, and damage such as cracks to be caused in the glass layers 21 due to the stress are reduced, and a circuit board that excels in performance and reliability is obtained as described above.

Next, a fifth embodiment is described.

Figure 17A:
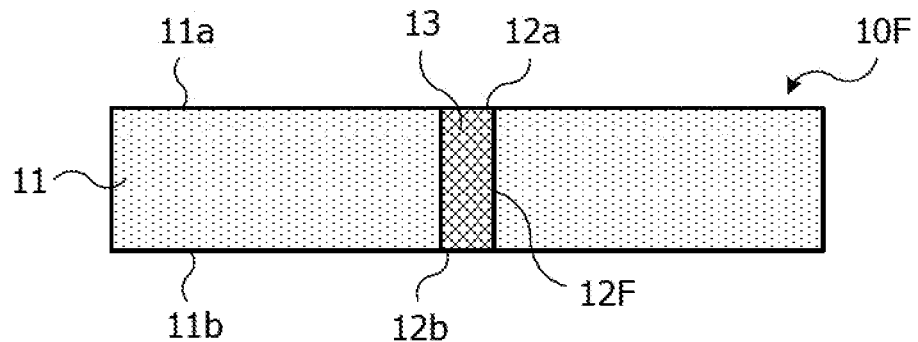
FIGS. 17A to 17C are explanatory views of examples of circuit boards according to a fifth embodiment.
Figure 17B:
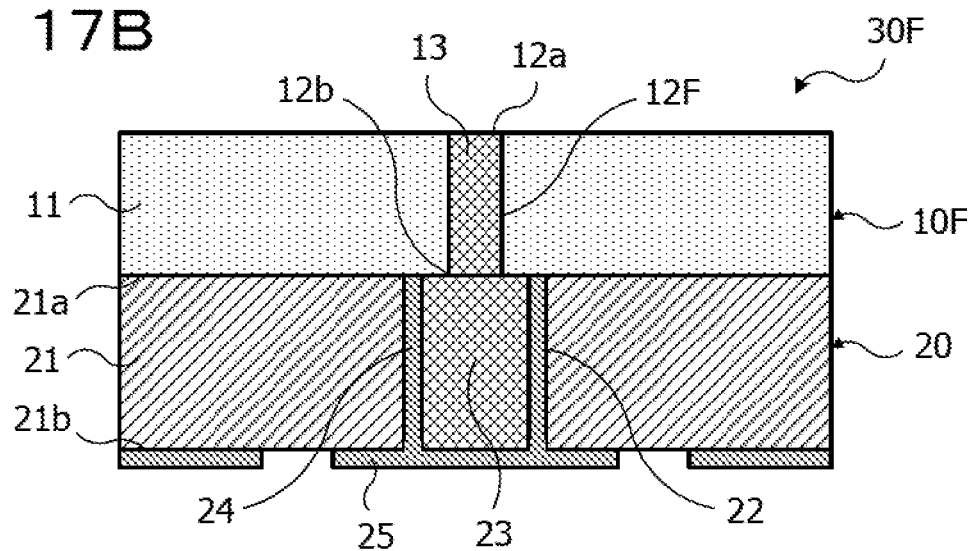
Figure 17C:
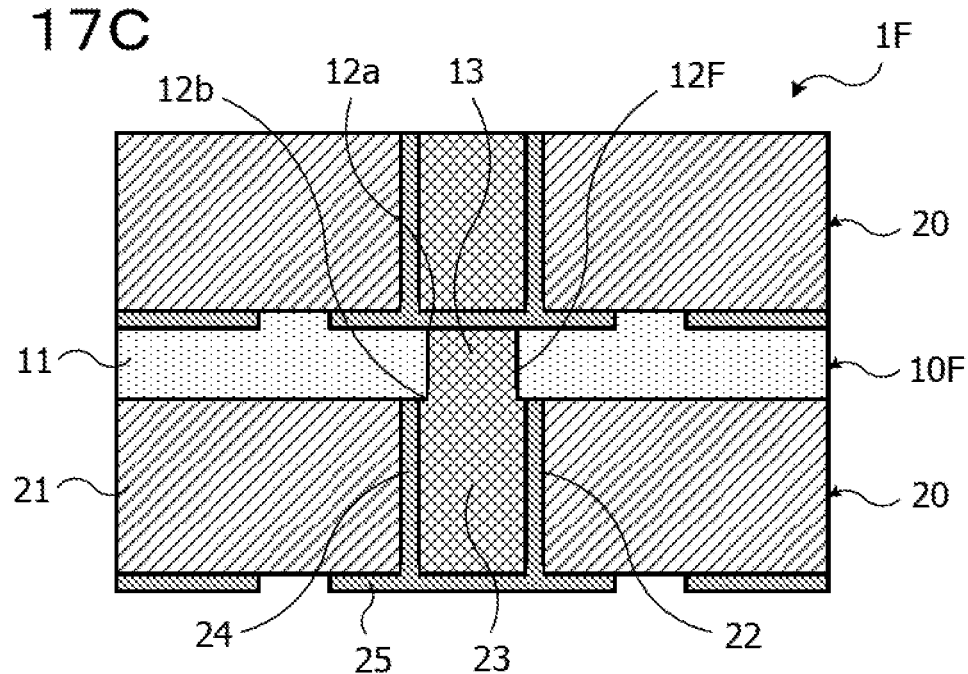

FIGS. 17A to 17C are explanatory views of an example of a circuit board according to the fifth embodiment. FIG. 17A schematically illustrates a cross-section of the relevant portion of an example of a resin substrate according to the fifth embodiment. FIG. 17B schematically illustrates a cross-section of the relevant portion of an example of a bonded substrate formed by bonding a resin substrate and a glass substrate to each other according to the fifth embodiment. FIG. 17C schematically illustrates a cross-section of the relevant portion of an example of a circuit board according to the fifth embodiment.

As illustrated in FIGS. 17A and 17B, a resin substrate 10F has a through hole 12F that has a smaller fixed diameter than the inner diameter of the metal layer 24 (or the outer diameter of the conductive composite resin 23 provided on the inner side of the metal layer 24) formed on the inner wall of the through hole 22 of each glass substrate 20. Such a through hole 12F is filled with a conductive composite resin 13. Bonded substrates 30F each formed by bonding the resin substrate 10F to a glass substrate 20 as illustrated in FIG. 17B are stacked and are thermally pressed. Alternatively, resin substrates 10F and glass substrates 20 are alternately stacked and are thermally pressed. In this manner, a circuit board 1F illustrated in FIG. 17C is obtained.

In the circuit board 1F, a through hole 12F having a fixed diameter is formed in each resin substrate 10F. This enables easier formation of the resin substrates 10F, and the bonded substrates 30F and the circuit board 1F using the resin substrates 10F.

Although the example in which resin substrates 10F and glass substrates 20 are stacked has been described, the resin substrates 10F and other glass substrates 20A or 20B may be stacked.

Next, a sixth embodiment is described.

Figure 18A:
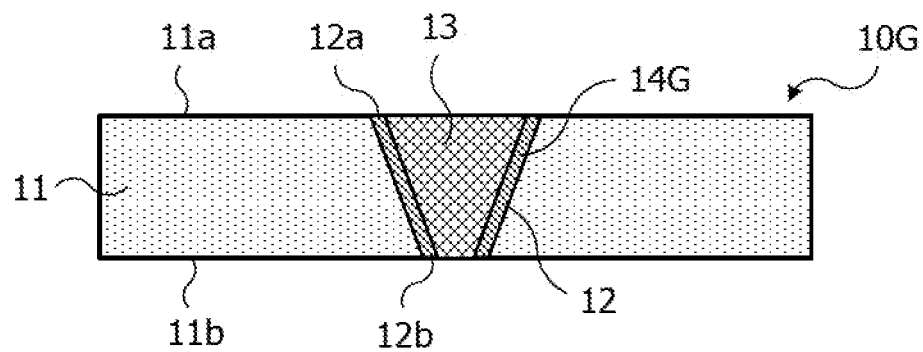
FIGS. 18A and 18B are explanatory views of an example of a circuit board according to a sixth embodiment.
Figure 18B:
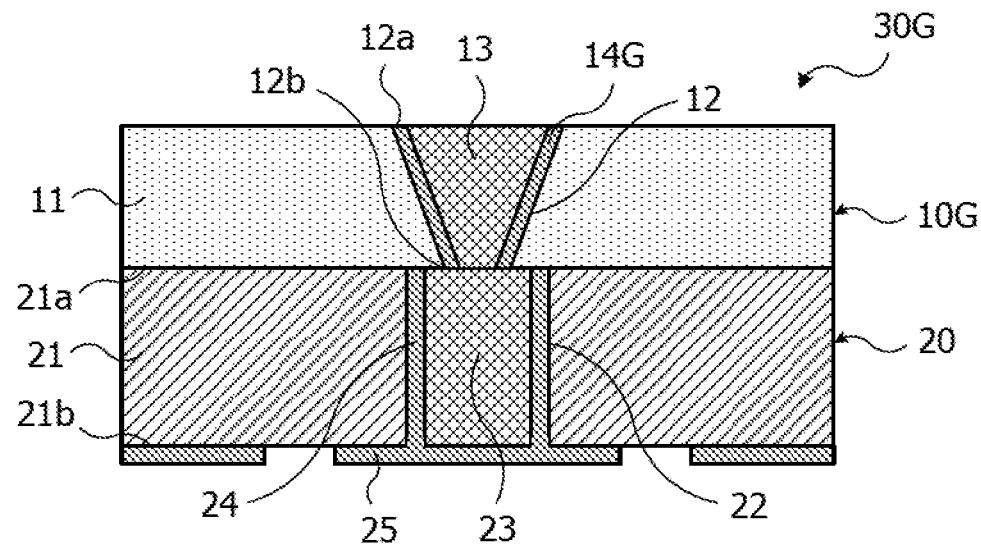
Figure 19A:
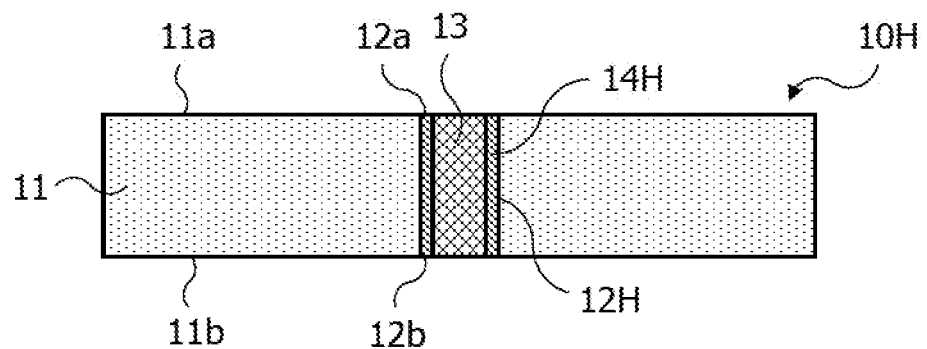
FIGS. 19A and 19B are explanatory views of an example of a circuit board according to the sixth embodiment.
Figure 19B:
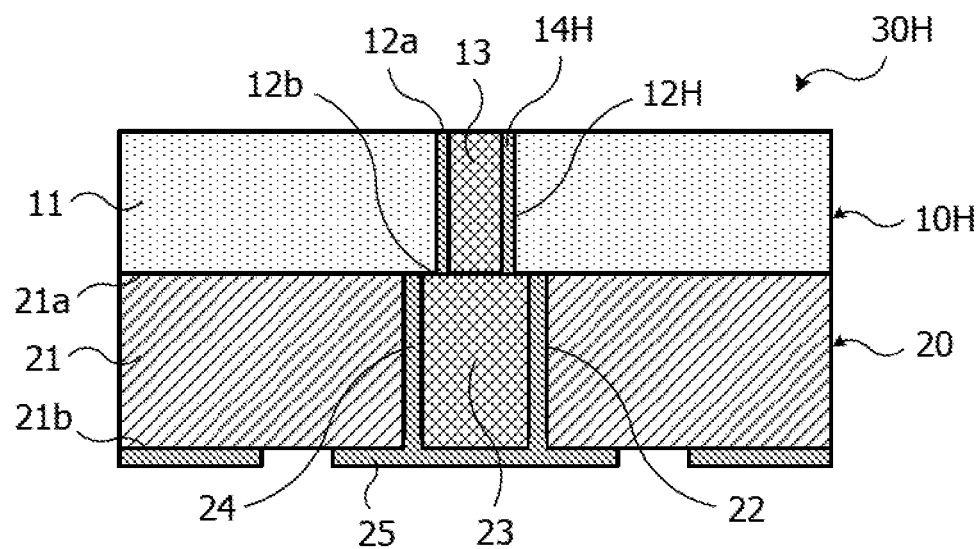

FIGS. 18A to 19B are explanatory views of examples of circuit boards according to the sixth embodiment. FIG. 18A schematically illustrates a cross-section of the relevant portion of a first example of a resin substrate according to the sixth embodiment. FIG. 18B schematically illustrates a cross-section of the relevant portion of a first example of a bonded substrate formed by bonding a resin substrate and a glass substrate to each other according to the sixth embodiment. FIG. 19A schematically illustrates a cross-section of the relevant portion of a second example of a resin substrate according to the sixth embodiment. FIG. 19B schematically illustrates a cross-section of the relevant portion of a second example of a bonded substrate formed by bonding a resin substrate and a glass substrate to each other according to the sixth embodiment.

A resin substrate 10G illustrated in FIG. 18A differs from the resin substrate 10 described above in the first embodiment, in having a structure in which a metal layer 14G is formed on the inner wall of the through hole 12 in the resin layer 11, and the conductive composite resin 13 is provided on the inner side of the metal layer 14G. Such a resin substrate 10G is formed by forming the through hole 12 in the resin layer 11 by laser processing or the like, forming the metal layer 14G on the inner wall of the through hole 12 by a technique such as plating or sputtering, printing a conductive paste, and filling the inner side of the metal layer 14G with the conductive composite resin 13. Bonded substrates 30G each formed by bonding the resin substrate 10G to a glass substrate 20 as illustrated in FIG. 18B are stacked and are thermally pressed. Alternatively, resin substrates 10G and glass substrates 20 are alternately stacked and are thermally pressed. In this manner, a circuit board is obtained. Note that, at the time of thermal pressing, the metal layer 14G formed on the inner wall of the through hole 12 in each resin layer 11 might be curved or bent. Further, at the time of thermal pressing, the metal layer 14G might enter (or be buried in) the through hole 22 of each glass layer 21.

In a circuit board including the resin substrate 10G, the presence of the metal layer 14G around the conductive composite resin 13 of the resin layer 11 lowers the resistance of the via of the resin substrate 10G, and lowers the resistance of the via connecting portions in the circuit board. Even in a case where the metal layer 14G is curved or bent at the time of thermal pressing, and is buried in the through holes 22 of the glass layers 21, the presence of the metal layer 14G around the conductive composite resin 13 lowers the resistance of the via of the resin substrate 10G, and lowers the resistance of the via connecting portions in the circuit board.

A resin substrate 10H illustrated in FIG. 19A differs from the resin substrate 10F described above in the fifth embodiment, in having a structure in which a metal layer 14H is formed on the inner wall of a fixed-diameter through hole 12H formed in the resin layer 11, and the conductive composite resin 13 is provided on the inner side of the metal layer 14H. Such a resin substrate 10H is formed by forming the through hole 12H in the resin layer 11 by laser processing or the like, forming the metal layer 14H on the inner wall of the through hole 12H by a technique such as plating or sputtering, printing a conductive paste, and filling the inner side of the metal layer 14H with the conductive composite resin 13. Bonded substrates 30H each formed by bonding the resin substrate 10H to a glass substrate 20 as illustrated in FIG. 19B are stacked and are thermally pressed. Alternatively, resin substrates 10H and glass substrates 20 are alternately stacked and are thermally pressed. In this manner, a circuit board is obtained. Note that, at the time of thermal pressing, the metal layer 14H formed on the inner wall of the through hole 12H in each resin layer 11 might be curved or bent. Further, at the time of thermal pressing, the metal layer 14H might enter (or be buried in) the through hole 22 of each glass layer 21.

In a circuit board including the resin substrate 10H, the presence of the metal layer 14H around the conductive composite resin 13 of the resin layer 11 lowers the resistance of the via of the resin substrate 10H, and lowers the resistance of the via connecting portions in the circuit board. Even in a case where the metal layer 14H is curved or bent at the time of thermal pressing, and is buried in the through holes 22 of the glass layers 21, the presence of the metal layer 14H around the conductive composite resin 13 lowers the resistance of the via of the resin substrate 10H, and lowers the resistance of the via connecting portions in the circuit board.

FIG. 18B and FIG. 19B illustrate the bonded substrate 30G and the bonded substrate 30H, respectively, in which the resin substrate 10G and the resin substrate 10H are bonded to glass substrates 20. However, it is possible to form bonded substrates by bonding the resin substrate 10G and the resin substrate 10H to other glass substrates 20A or 20B.

Next, a seventh embodiment is described.

Various electronic components, including semiconductor devices such as semiconductor chips and semiconductor packages, may be mounted on a circuit board that is similar to those described in the first through sixth embodiments described above.

Figure 20:
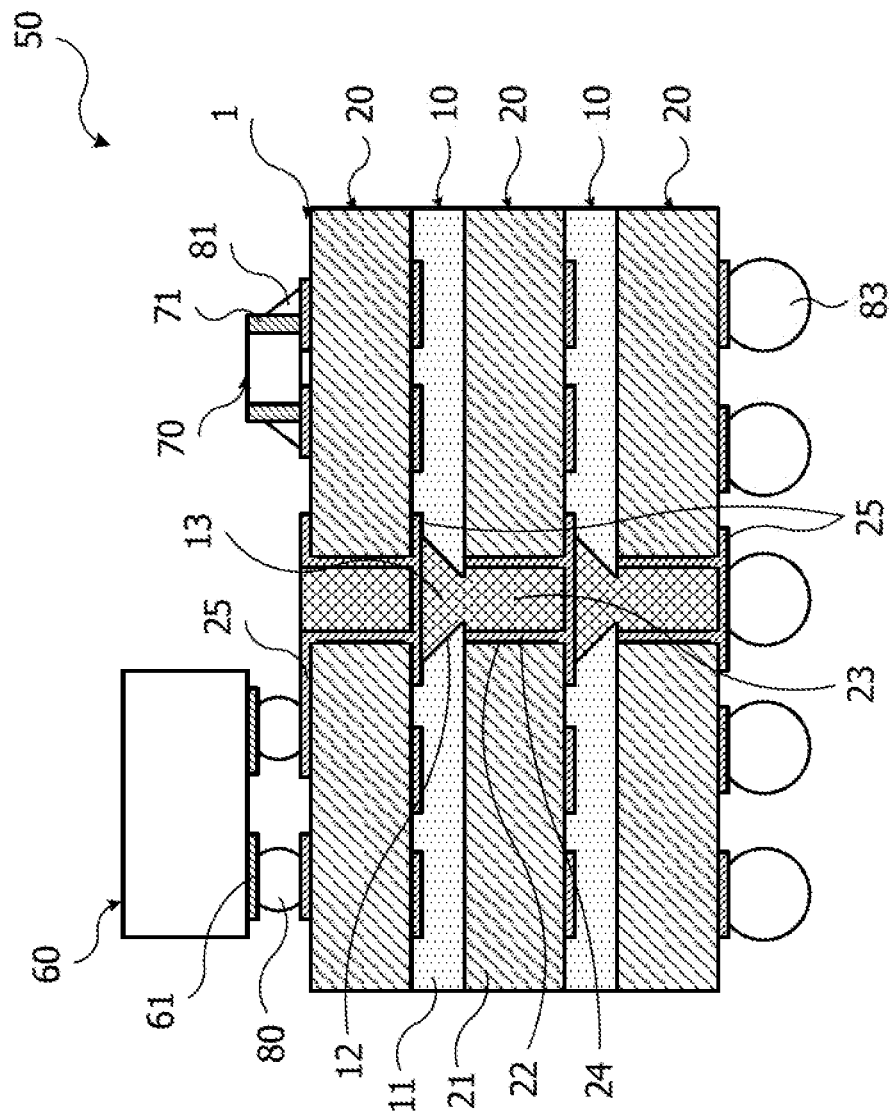
FIG. 20 is a view of an example of an electronic device according to a seventh embodiment.

FIG. 20 is a view of an example of an electronic device according to the seventh embodiment. FIG. 20 schematically illustrates a cross-section of the relevant portion of an example of an electronic device according to the seventh embodiment.

In this description, the circuit board 1 described in the above described first embodiment is taken as an example. An electronic device 50 illustrated in FIG. 20 includes the circuit board 1, and an electronic component 60 and an electronic component 70 that are mounted on the circuit board 1. The electronic component 60 is a semiconductor chip or a semiconductor package including a semiconductor chip, for example, and its terminals 61 are joined to a metal layer 25 (terminals) of the circuit board 1 via bumps 80 formed with solders or the like. The electronic component 70 is a chip component such as a chip capacitor, for example, and its terminals 71 are joined to a metal layer 25 (terminals) of the circuit board 1 with joining members 81 such as solders. As illustrated in FIG. 20, in the circuit board 1, bumps 83 to be used for connecting this electronic device 50 further to another electronic component (such as a circuit board) may be provided on the metal layer 25 (terminals) formed on the surface on the opposite side from the surface on which the electronic component 60 and the electronic component 70 are mounted.

In the circuit board 1, the conductive composite resin 13 of each resin substrate 10 is connected to the conductive composite resin 23 of the glass substrate 20 on the lower side, so that the forces to be applied to the metal layers 24 and the metal layers 25 of the upper and lower glass substrates 20 are reduced. As a result, the stress to be generated in the via connecting portions between each resin substrate 10 and the glass substrates 20 on and below the resin substrate 10, and damage such as cracks to be caused in the glass layers 21 due to the stress are reduced, and the circuit board 1 that excels in performance and reliability is obtained. As this circuit board 1 is used, the electronic device 50 that excels in performance and reliability is obtained.

Although the electronic device 50 using the circuit board 1 described in the above described first embodiment has been described as an example, it is also possible to form an electronic device using some other circuit board such as one of the circuit boards 1A, 1B, and 1F, which have been described in the second through sixth embodiments described above.

Next, an eighth embodiment is described.

The circuit boards described in the first through sixth embodiments described above, or an electronic device obtained using such a circuit board may be mounted on various kinds of electronic apparatuses. For example, such an electronic device can be mounted on any of various electronic apparatuses, such as computers (personal computers, supercomputers, servers, and the like), smartphones, portable telephones, tablet terminals, sensors, cameras, audio devices, measuring devices, inspection devices, manufacturing devices, and the like.

Figure 21:
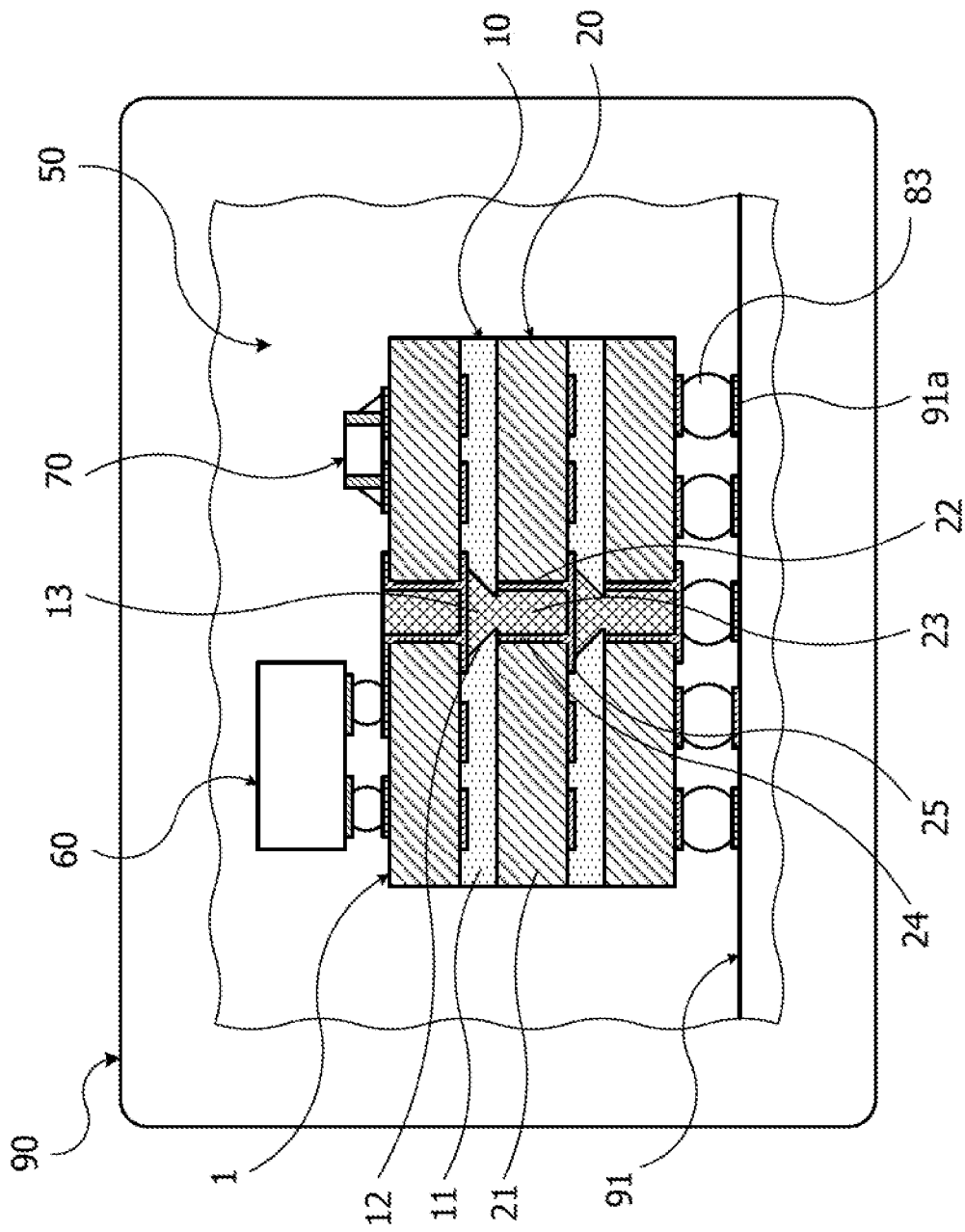
FIG. 21 is an explanatory view of an electronic apparatus according to an eighth embodiment.

FIG. 21 is an explanatory view of an electronic apparatus according to the eighth embodiment. FIG. 21 schematically illustrates an example of an electronic apparatus.

As illustrated in FIG. 21, the electronic device 50 (FIG. 20) described in the above described seventh embodiment, for example, is mounted (embedded) in any of various electronic apparatuses 90. For example, the electronic device 50 is bonded to terminals 91a of a circuit board 91 via the bumps 83, and is incorporated into an electronic apparatus 90 while being mounted on the circuit board 91.

In the electronic device 50, the conductive composite resin 13 of each resin substrate 10 is connected to the conductive composite resin 23 of the glass substrate 20 on the lower side, so that the forces to be applied to the metal layers 24 and the metal layers 25 of the upper and lower glass substrates 20 are reduced, and damage such as cracks in the glass layers 21 due to stress is reduced. As a result, the electronic device 50 that excels in performance and reliability is obtained, and the electronic apparatus 90 that has the electronic device 50 mounted thereon and excels in reliability and performance is obtained.

The electronic apparatus 90 on which the electronic device 50 using the circuit board 1 described in the above described seventh embodiment is mounted has been described as an example. However, other circuit boards such as the circuit boards 1A, 1B, and 1F described above in the second through sixth embodiments described above, and electronic devices using those circuit boards may also be mounted on various kinds of electronic apparatuses.

Although example cases where glass substrates are stacked together with resin substrates have been described, the above method may also be applied in cases where substrates that are not necessarily glass substrates but are made of some other material such as an organic material, a semiconductor material, or a ceramic material are stacked together with resin substrates. As the above method is used, it is possible to reduce the stress to be generated in the via connecting portions between various substrates and resin substrates stacked thereon, and reduce the damage to be caused by the stress in the various substrates.

Note that, in the various circuit boards described above, such as the circuit board 1, the number of the various substrates such as the glass substrates 20 and the number of the various resin substrates such as the resin substrates 10 are not limited to any particular numbers.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A circuit board comprising:
   a first substrate including a first through hole, a first metal layer formed over an inner wall of the first through hole, and a first conductive composite resin provided on an inner side of the first metal layer of the first through hole; and
   a second substrate stacked together with the first substrate and including a second through hole that faces the first through hole and has a first open end which is provided on a side of the first through hole and is located on the inner side of the first metal layer, and a second conductive composite resin that is provided in the second through hole and is coupled to the first conductive composite resin,
   wherein a diameter of the inner side of the first metal layer formed on an inner side of the first through hole has a greater value than a diameter of a first open end-side end of the second conductive composite resin,
   the first open end-side end of the second conductive composite resin is not directly connected to the first metal layer but is directly connected to only the first conductive composite resin provided on the inner side of the first metal layer,
   wherein the second through hole has a second open end on the opposite side from the first open end, and the second open end has a greater inner diameter than the first open end, and
   further comprising
   a third substrate that is stacked over the second substrate on the opposite side from the first substrate, and includes a third through hole that faces the second through hole, a third metal layer provided over an inner wall of the third through hole, and a third conductive composite resin provided on an inner side of the third metal layer of the third through hole,
   wherein an outer edge of the second conductive composite resin is located outside an inner edge of the third metal layer.

2. The circuit board according to claim 1, wherein the first substrate is a glass substrate, and the second substrate is a resin substrate.

3. The circuit board according to claim 1, wherein the first substrate further includes a second metal layer over a second surface on the opposite side from a first surface facing the second substrate, the second metal layer closing the first through hole and being coupled to the first metal layer.

4. The circuit board according to claim 1, wherein the third substrate further includes a fourth metal layer over a third surface facing the second substrate, the fourth metal layer closing the third through hole and being coupled to the third metal layer, and the second conductive composite resin is coupled to the fourth metal layer.

5. The circuit board according to claim 1, wherein the third conductive composite resin is coupled to the second conductive composite resin.

6. A method of manufacturing a circuit board, comprising stacking a first substrate and a second substrate,
   the first substrate including a first through hole, a metal layer formed over an inner wall of the first through hole, and a first conductive composite resin provided on an inner side of the metal layer of the first through hole,
   the second substrate including a second through hole and a second conductive composite resin provided in the second through hole,
   wherein the second through hole is formed to face the first through hole and have an open end on a side of the first through hole, the open end being located on an inner side of the metal layer,
   the first conductive composite resin is coupled to the second conductive composite resin, and
   wherein a diameter of the inner side of the first metal layer formed on an inner side of the first through hole has a greater value than a diameter of a first open end-side end of the second conductive composite resin,
   the first open end-side end of the second conductive composite resin is not directly connected to the first metal layer but is directly connected to only the first conductive composite resin provided on the inner side of the first metal layer,
   wherein the second through hole has a second open end on the opposite side from the first open end, and the second open end has a greater inner diameter than the first open end,
   further comprising:
   stacking, over the second substrate on the opposite side from the first substrate, a third substrate including a third through hole that faces the second through hole, a third metal layer provided over an inner wall of the third through hole, and a third conductive composite resin provided on an inner side of the third metal layer of the third through hole,
   wherein an outer edge of the second conductive composite resin is located outside an inner edge of the third metal layer.

7. The method according to claim 6, wherein the first substrate is a glass substrate, and the second substrate is a resin substrate.

8. The method according to claim 6, wherein the first substrate further includes a second metal layer over a second surface on the opposite side from a first surface facing the second substrate, the second metal layer closing the first through hole and being coupled to the first metal layer.

9. An electronic device comprising:
   a circuit board; and
   an electronic component mounted on the circuit board,
   wherein the circuit board includes:
   a first substrate including a first through hole, a first metal layer formed over an inner wall of the first through hole, and a first conductive composite resin provided on an inner side of the first metal layer of the first through hole; and
   a second substrate stacked together with the first substrate and including a second through hole that faces the first through hole and has a first open end which is provided on a side of the first through hole and is located on the inner side of the first metal layer, and a second conductive composite resin that is provided in the second through hole and is coupled to the first conductive composite resin, and
   wherein a diameter of the inner side of the first metal layer formed on an inner side of the first through hole has a greater value than a diameter of a first open end-side end of the second conductive composite resin,
   the first open end-side end of the second conductive composite resin is not directly connected to the first metal layer but is directly connected to only the first conductive composite resin provided on the inner side of the first metal layer, wherein the second through hole has a second open end on the opposite side from the first open end, and the second open end has a greater inner diameter than the first open end, wherein the circuit board includes:

a third substrate that is stacked over the second substrate on the opposite side from the first substrate, and includes a third through hole that faces the second through hole, a third metal layer provided over an inner wall of the third through hole, and a third conductive composite resin provided on an inner side of the third metal layer of the third through hole, wherein an outer edge of the second conductive composite resin is located outside an inner edge of the third metal layer.

10. The electronic device according to claim 9, wherein the first substrate is a glass substrate, and the second substrate is a resin substrate.

11. The electronic device according to claim 9, wherein the first substrate further includes a second metal layer over a second surface on the opposite side from a first surface facing the second substrate, the second metal layer closing the first through hole and being coupled to the first metal layer.

* * * * *